(12) United States Patent
Akizuki et al.

(10) Patent No.: US 7,777,663 B2
(45) Date of Patent: Aug. 17, 2010

(54) DISCRETE TIME AMPLIFIER CIRCUIT AND ANALONG-DIGITAL CONVERTER

(75) Inventors: Taiji Akizuki, Miyagi (JP); Tomoaki Maeda, Hiroshima (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/261,704

(22) Filed: Oct. 30, 2008

(65) Prior Publication Data
US 2009/0115523 A1   May 7, 2009

(30) Foreign Application Priority Data
Nov. 5, 2007   (JP) .............................. 2007-287217

(51) Int. Cl.
*H03M 1/12* (2006.01)
(52) U.S. Cl. ...................................... 341/172; 341/155
(58) Field of Classification Search ................. 341/139, 341/172, 155, 122; 330/258, 259, 260, 292
See application file for complete search history.

(56) References Cited

U.S. PATENT DOCUMENTS

| | | | |
|---|---|---|---|
| 4,543,538 A * | 9/1985 | Fay | ............................ 330/260 |
| 5,847,601 A | 12/1998 | Wang | |
| 6,087,897 A | 7/2000 | Wang | |
| 6,697,001 B1 | 2/2004 | Oliaei et al. | |
| 6,774,722 B2 * | 8/2004 | Hogervorst | .................. 330/258 |
| 7,492,296 B1 * | 2/2009 | Drakshapalli et al. | ........ 341/139 |

FOREIGN PATENT DOCUMENTS

JP   3485895   10/2003

OTHER PUBLICATIONS

Taniguchi, *Introduction to CMOS Analog Circuit for LSI Designers*. Sep. 1, 2005, Issue of $3^{rd}$ Edition, pp. 216-220 and English translation.

* cited by examiner

*Primary Examiner*—Brian Young
(74) *Attorney, Agent, or Firm*—Hamre, Schumann, Mueller & Larson, P.C.

(57) ABSTRACT

The present invention is intended to attain simplified circuit configuration and low current consumption in a discrete time amplifier circuit and an AD converter, to improve the convergence from the transient response state to the steady state of the amplifier circuit and to reduce noise and distortion owing to the variation in the output common-mode voltage. The discrete time amplifier circuit and the AD converter are provided with a switched-capacitor common-mode feedback (CMFB) circuit capable of detecting and feeding back the output common-mode voltage at every sampling timing in the case that the circuit operates at double sampling timing (every ½ cycle).

14 Claims, 15 Drawing Sheets

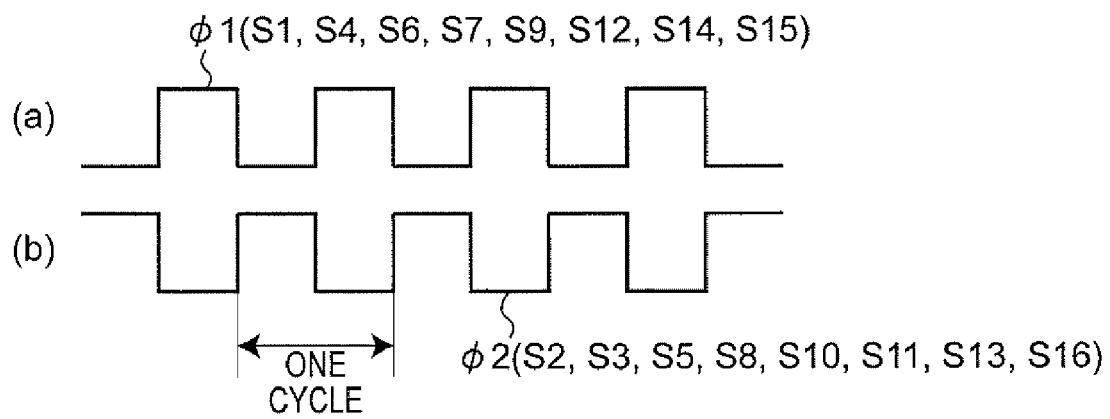
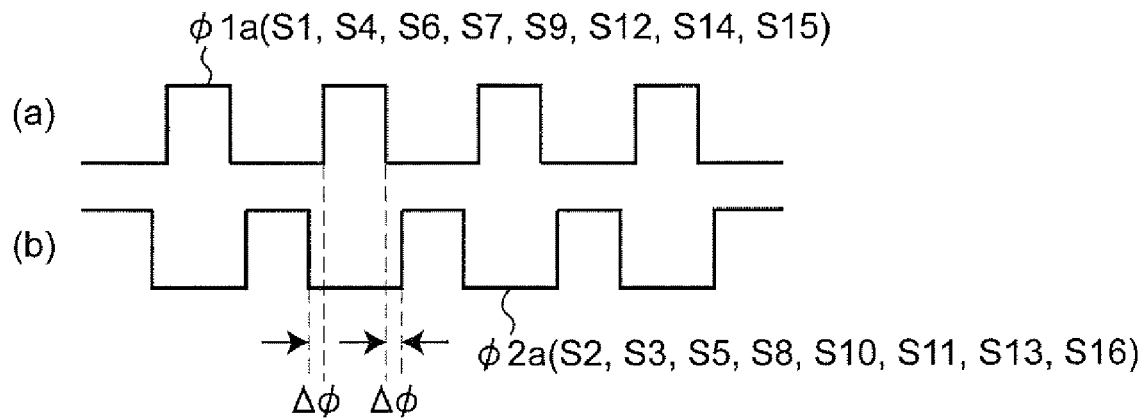

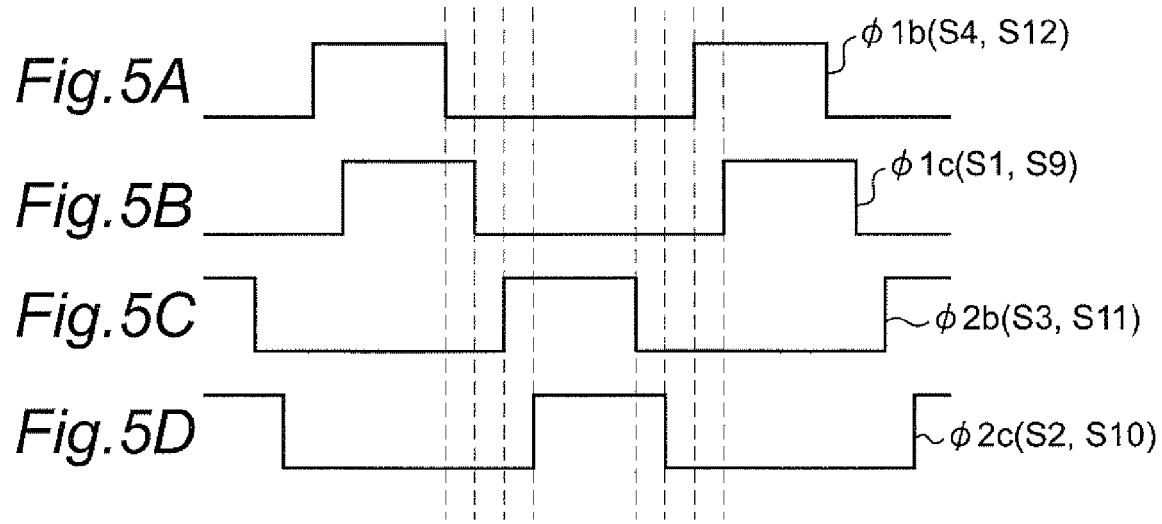
*Fig.5A* φ1b(S4, S12)
*Fig.5B* φ1c(S1, S9)
*Fig.5C* φ2b(S3, S11)
*Fig.5D* φ2c(S2, S10)
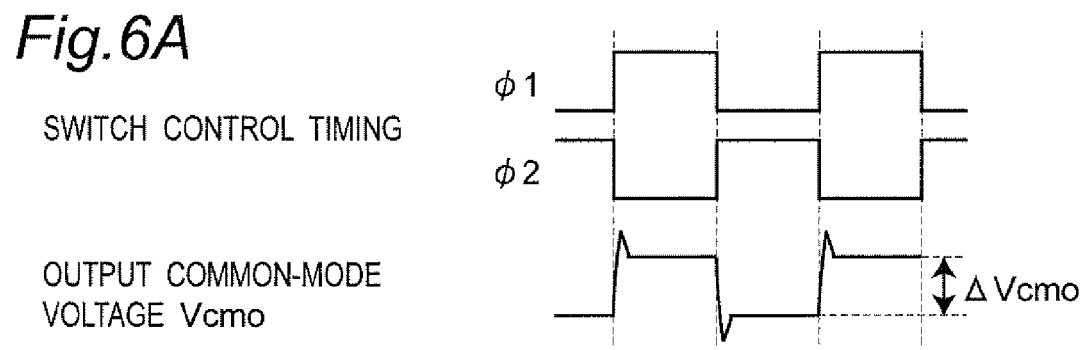
*Fig.6A*
SWITCH CONTROL TIMING
φ1
φ2
OUTPUT COMMON-MODE VOLTAGE Vcmo
ΔVcmo
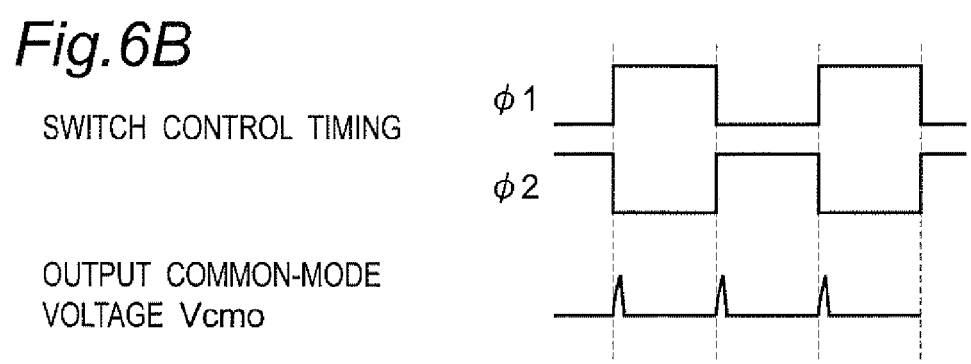
*Fig.6B*
SWITCH CONTROL TIMING
φ1
φ2
OUTPUT COMMON-MODE VOLTAGE Vcmo Fig.7A SINGLE SAMPLING CMFB CIRCUIT
Fig.7B DOUBLE SAMPLING CMFB CIRCUIT
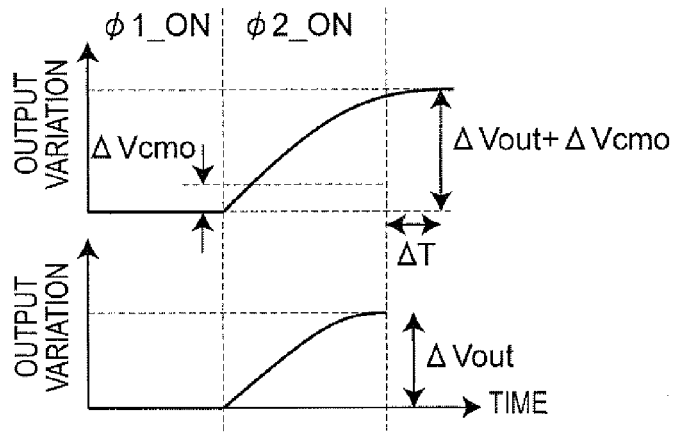
Fig.8A SINGLE SAMPLING CMFB CIRCUIT
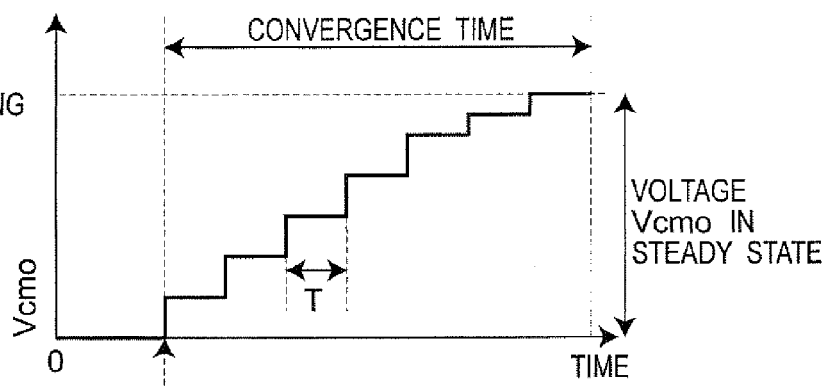
Fig.8B DOUBLE SAMPLING CMFB CIRCUIT
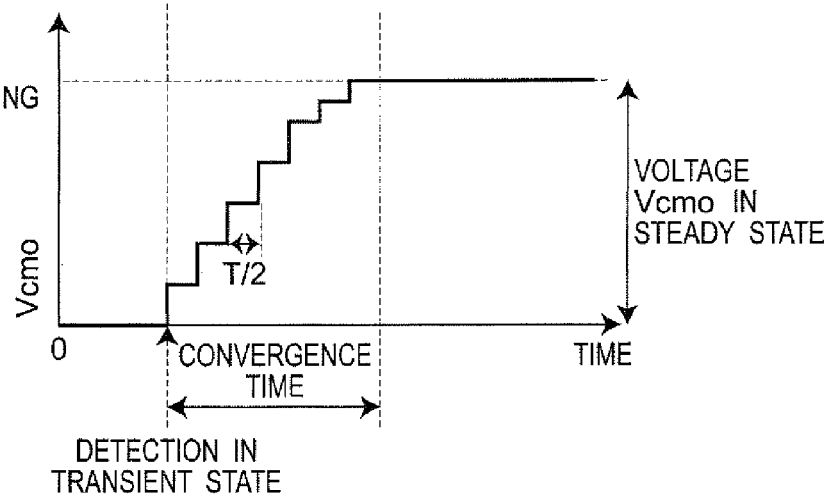

DISCRETE TIME AMPLIFIER CIRCUIT AND ANALONG-DIGITAL CONVERTER

BACKGROUND OF THE INVENTION

The present invention relates to an amplifier circuit operating at high speed, more particularly, to a discrete time amplifier circuit and an analog-digital converter incorporating the amplifier circuit.

Signal transmission and processing can be carried out easily and efficiently by converting analog signals into digital signals. For this reason, an analog-digital converter (hereafter abbreviated as an AD converter) is a device having important functions in wireless receivers for use in mobile telephones and the like.

As data transmission speed becomes higher owing to the broadbandization of the recent communication systems, the double sampling operation technology capable of alleviating the settling characteristics of an operational amplifier serving as an analog circuit becomes more important to simultaneously attain high data transmission speed and low current consumption.

Furthermore, in the case that an AD converter is incorporated in an IC of a compact apparatus, such as a mobile telephone, such an AD converter is an important element in reducing the size and current consumption of apparatuses. Moreover, a common-mode feedback circuit (hereafter abbreviated as a CMFB circuit) constituting an amplifier circuit inside an AD converter is also required to meet the needs for reducing the size and current consumption of apparatuses.

FIG. 19 is a circuit diagram of a conventional amplifier circuit described in Japanese Patent No. 3485895. This amplifier circuit is an offset compensation and nonlinear compensation type. As shown in FIG. 19, an input voltage Vin is input to a sampling capacitor C1 via a switch SW1. The sampling capacitor C1 is disposed between the switches SW1 and SW4 and connected to the input of a single-stage main amplifier 2 via the switch SW4. Furthermore, both terminals of the sampling capacitor C1 are connected to a reference voltage source 14 via switches SW2 and SW3.

A switched-capacitor circuit including a switched feedback capacitor C2 is connected between the input and the output of the main amplifier 2. One terminal of the switched feedback capacitor C2 is provided with a switch SW6 connected to the input of the main amplifier 2 and a switch SW7 connected to the reference voltage source 14. The other terminal of the switched feedback capacitor C2 is provided with a switch SW8 connected to the reference voltage source 14 and a switch SW9 connected to the output of the main amplifier 2. The output of the main amplifier 2 is connected to one terminal of a switched capacitor C3. The other terminal of the switched capacitor C3 is connected to the reference voltage source 14 via a switch SW11. A load circuit 4, for example, a delta-sigma modulator having a sampling capacitor C5, is connected to the output of the main amplifier 2.

The main amplifier 2 has source-connected MOS FETs 7 and 8, and the common sources of the MOS FETs 7 and 8 are connected to a constant current source 9. The drains of the FETs 7 and 8 are connected to a power source (voltage V+) via load devices (constant current load circuits) 5 and 6. The gate of the MOS FET 7 is connected to the input of the main amplifier 2, and the gate of the MOS FET 8 is connected to the reference voltage source 14. The main amplifier 2 is provided with a differential amplifier 10 to which signals from the constant current load circuits 5 and 6 are input, and the output of this differential amplifier 10 becomes the output Vout of the main amplifier 2.

An auxiliary amplifier 3 includes a pair of source-connected MOS FETs 11 and 12, and the sources thereof are connected to a constant current source 13. The gate of the MOS FET 12 is connected to the connection point between a switched capacitor C3 and a switch SW11 via a switch SW10 and also connected to one terminal of a capacitor C4. The other terminal of the capacitor C4 is connected to the reference voltage source 14, the (+) input of the auxiliary amplifier 3 and the gate of the MOS FET 11. The drain of the MOS FET 12 is connected to the drain of the MOS FET 7 of the main amplifier 2. On the other hand, the drain of the MOS FET 11 is connected to the drain of the MOS FET 8 of the main amplifier 2.

In the conventional amplifier circuit configured as described above, the switches SW2, SW4, SW6, SW9, SW11, SW12 and SW14 simultaneously perform ON/OFF operations in response to a signal $\phi 1$. Alternately with the operations of these switches, the switches SW1, SW3, SW5, SW7, SW8, SW10, SW13 and SW15 simultaneously perform ON/OFF operations in response to a signal $\phi 2$. By the switching operations of the above-mentioned switches, the auxiliary amplifier 3 compensates for the input offset voltage of the main amplifier 2 in response to the offset error compensation voltage stored transiently in the capacitor C4.

However, since common-mode feedback control (CMFB control) cannot be performed at double sampling timing in the conventional amplifier circuit configured as described above, the output common-mode voltage varies every half cycle, and there is a problem in which the characteristics of the amplifier circuit deteriorate.

A fully differential amplifier circuit having a common-mode feedback circuit (CMFB circuit) is available as an amplifier circuit capable of performing CMFB control. FIG. 20 is a schematic block diagram showing a fully differential amplifier circuit having a CMFB circuit. As shown in FIG. 20, the CMFB circuit of the fully differential amplifier circuit is a circuit for performing feedback so that the output common-mode voltage Vcmo, i.e., the average value of two output voltages Vout+ and Vout−, becomes a predetermined value (reference voltage: Vref). This kind of CMFB circuit is broadly classified into two types: a continuous time CMFB circuit to/from which a continuous signal is input/output and a discrete time CMFB circuit for processing a cyclic or discrete signal.

The continuous time CMFB circuit feeds back the variation in the output common-mode voltage Vcmo from the reference voltage Vref to the fully differential amplifier circuit continuously. The continuous time CMFB circuit is formed of transistors and an operational amplifier and advantageous in that the output common-mode voltage can be fed back in response to double sampling timing.

However, the continuous time CMFB circuit is disadvantageous in that the circuit is complicated and that current consumption is increased since the circuit operates at all times. Furthermore, if the performance of the active elements used therein changes, the characteristics of the circuit change, and there is a problem in which the control range that can be used to ensure the credibility of the active elements used therein is restricted.

On the other hand, the discrete time CMFB circuit feeds back the variation in the output common-mode voltage Vcmo from the reference voltage Vref in one cycle period. The discrete time CMFB circuit is formed of capacitors and switches and has no operational amplifier. Hence, the circuit is simplified easily, and the characteristics of the circuit elements thereof do not vary significantly. For these reasons, the discrete time CMFB circuit is advantageous in that the control range that can be used is not restricted.

However, since the discrete time CMFB circuit performs sampling (single sampling) every cycle and cannot perform CMFB control at double sampling timing, there is a problem in which the output common-mode voltage varies every half cycle and the characteristics of the operational amplifier deteriorate. Moreover, since the discrete time CMFB circuit performs feedback every cycle, there is a problem in which the initial pull-in period elapsing until the steady state is attained takes time.

Since the conventional amplifier circuit shown in FIG. 19 cannot perform CMFB control at double sampling timing (circuit operation performed every half cycle) as described above, the output common-mode voltage varies every half cycle, and there is a problem in which the characteristics of the operational amplifier deteriorate.

Furthermore, the conventional continuous time CMFB circuit is disadvantageous in that the circuit is complicated and that current consumption is increased since the circuit operates at all times. Moreover, if the performance of the active elements used therein changes, the characteristics of the circuit change, and there is a problem in which the control range that can be used is restricted.

Still further, since the conventional discrete time CMFB circuit cannot perform CMFB control at double sampling timing, there is a problem in which the output common-mode voltage varies every half cycle and the characteristics of the operational amplifier deteriorate. Moreover, since the conventional discrete time CMFB circuit performs feedback every cycle, there is a problem in which the so-called settling time becomes long, that is, the initial pull-in period elapsing until the steady state is attained takes time.

SUMMARY OF THE INVENTION

For the purpose of simultaneously attaining high data transmission speed and low current consumption, the present invention is intended to provide a discrete time amplifier circuit having a simple circuit configuration, operating at double sampling timing and capable of shortening convergence time and to provide an AD converter incorporating this discrete time amplifier circuit.

A discrete time amplifier circuit according to a first aspect of the present invention has a differential amplifier for amplifying a differential signal and a common-mode feedback circuit for feeding back the output voltage to the differential amplifier so that the output voltage is controlled to a reference voltage, wherein the common-mode feedback circuit comprises:

a first switched-capacitor circuit being connected, by switching every ½ cycle, to a reference voltage source or the input/output terminals of the common-mode feedback circuit to repeat sampling mode and hold mode, a second switched-capacitor circuit being connected, by switching every ½ cycle, to the reference voltage source or the input/output terminals at a timing shifted by a ½ cycle from the switching timing of the first switched-capacitor circuit to repeat sampling mode and hold mode, and a common-mode feedback voltage generating circuit for generating and holding a common-mode feedback voltage using charges input from the first switched-capacitor circuit and the second switched-capacitor circuit. The discrete time amplifier circuit configured as described above is simple in circuit configuration and operates at double sampling timing, thereby capable of shortening the convergence time thereof. In Embodiment 1 of the present invention described later, the first switched-capacitor circuit will be described as comprising first sampling capacitors Ca1 and switches S2, S3, S6, S7, S10, S11, S14 and S15, and the second switched-capacitor circuit will be described as comprising second sampling capacitors Ca2 and switches S1, S4, S5, S8, S9, S12, S13 and S16.

A discrete time amplifier circuit according to a second aspect of the present invention may be characterized in that a first switching signal for ON/OFF driving the first switched-capacitor circuit according to the first aspect every ½ cycle and a second switching signal for ON/OFF driving the second switched-capacitor circuit according to the first aspect every ½ cycle are set so that the first switched-capacitor circuit and the second switched-capacitor circuit do not turn ON simultaneously.

A discrete time amplifier circuit according to a third aspect of the present invention may be characterized in that the first switched-capacitor circuit and the second switched-capacitor circuit according to the first aspect each comprise capacitors and multiple switches, and that the time interval is adjusted so that the switches that connect the capacitors of the first switched-capacitor circuit and the second switched-capacitor circuit to the input side of the common-mode feedback circuit turn OFF earlier than the switches that connect the capacitors to the output side of the common-mode feedback circuit.

A discrete time amplifier circuit according to a fourth aspect of the present invention may be characterized in that the switches of the first switched-capacitor circuit and the second switched-capacitor circuit according to the first aspect are formed of a MOS transistor, that each of the switches has a dummy switch formed of a MOS transistor, the drain and source of which are connected to the output side of each of the switches, that the gate area of the dummy switch is made smaller than the gate area of each of the switches, and that the dummy switch is set so as to turn OFF at the same timing as that of each of the switches.

A discrete time amplifier circuit according to a fifth aspect of the present invention may be characterized in that the switches of the first switched-capacitor circuit and the second switched-capacitor circuit according to the first aspect are formed of a CMOS transistor.

A discrete time amplifier circuit according to a sixth aspect of the present invention may be characterized in that the capacitors of the first switched-capacitor circuit and the second switched-capacitor circuit according to the first aspect are formed of wires and insulators.

A discrete time amplifier circuit according to a seventh aspect of the present invention may be characterized in that the common-mode feedback voltage generating circuit according to the first aspect comprises multiple capacitors having different capacitance values, and the common-mode feedback circuit further comprises a common-mode feedback selection controller for selecting and switching, the capacitance value of the common-mode feedback voltage generating circuit in a steady state and a transient response state.

A discrete time amplifier circuit according to an eighth aspect of the present invention may be characterized in that the common-mode feedback selection controller according to the seventh aspect is set so that the capacitance value to be selected in the transient response state becomes smaller gradually.

A discrete time amplifier circuit according to a ninth aspect of the present invention may be characterized in that the common-mode feedback selection controller according to the seventh aspect is set so that the capacitance value selected in the final stage of the transient response state and the capacitance value selected in the steady state are 10 times the stray capacitance of the circuit from which the capacitance values are selected.

A discrete time amplifier circuit according to a 10th aspect of the present invention may be characterized in that the common-mode feedback circuit according to the first aspect is composed of multiple common-mode feedback circuits having different closed-loop gains and conforming to double sampling, and further comprises a common-mode feedback selection controller for selecting, by switching, either one of the multiple common-mode feedback circuits in a steady state and a transient response state.

A discrete time amplifier circuit according to an 11th aspect of the present invention may be characterized in that the common-mode feedback circuit according to the first aspect is composed of multiple common-mode feedback circuits having different closed-loop gains and conforming to double sampling, and has a discrete time common-mode feedback circuit and a continuous time common-mode feedback circuit, and the common-mode feedback circuit further comprises a common-mode feedback selection controller for selecting, by switching, either one of the discrete time common-mode feedback circuit and the continuous time common-mode feedback circuit in the steady state and the transient response state.

A discrete time analog-digital converter according to a 12th aspect of the present invention comprises a discrete time amplifier circuit having an operational amplification section conforming to double sampling, a differential amplifier for amplifying a differential signal and a common-mode feedback circuit for feeding back the output voltage to the differential amplifier so that the output voltage is controlled to a reference voltage, wherein the common-mode feedback circuit comprises:

a first switched-capacitor circuit being connected, by switching every ½ cycle, to a reference voltage source or the input/output terminals of the common-mode feedback circuit to repeat a sampling mode and a hold mode, a second switched-capacitor circuit being connected, by switching every ½ cycle, to the reference voltage source or the input/output terminals at a timing shifted by a ½ cycle from the switching timing of the first switched-capacitor circuit to repeat the sampling mode and the hold mode, and a common-mode feedback voltage generating circuit for generating and holding a common-mode feedback voltage using charges input from the first switched-capacitor circuit and the second switched-capacitor circuit. The discrete time analog-digital converter configured as described above can simultaneously attain high data transmission speed and low current consumption and serves as a highly versatile device.

A discrete time analog-digital converter according to a 13th aspect of the present invention may be characterized in that the common-mode feedback voltage generating circuit according to the 12th aspect comprises multiple capacitors having different capacitance values, and the common-mode feedback circuit further comprises a common-mode feedback selection controller for selecting and switching, the capacitance value of the common-mode feedback voltage generating circuit in a steady state and a transient response state, and the common-mode feedback selection controller selects, by switching, the common-mode feedback circuit at predetermined time intervals in synchronization with the input of power source.

A discrete time analog-digital converter according to a 14th aspect of the present invention may be characterized in that the common-mode feedback voltage generating circuit according to the 12th aspect comprises multiple capacitors having different capacitance values, and the common-mode feedback circuit further comprises a common-mode feedback selection controller for selecting and switching, the capacitance value of the common-mode feedback voltage generating circuit in a steady state and a transient response state, and the common-mode feedback selection controller has a saturated state detection circuit for detecting that the analog input signal is in a saturated state by detecting that the digital output signal of the operational amplification section has reached its maximum or minimum for a preset continuous period or longer, and the common-mode feedback selection controller selects, by switching, the common-mode feedback circuit at preset time intervals when the analog input signal has returned from the saturated state.

The present invention provides a discrete time amplifier circuit having a simple circuit configuration, operating at double sampling timing and capable of shortening convergence time and provides an AD converter incorporating the discrete time amplifier circuit, thereby capable of simultaneously attaining high data transmission speed and low current consumption.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 3A and 3B are diagrams showing the waveforms of signals to be input to the respective switches of the CMFB circuit according to Embodiment 1;

FIGS. 4A and 4B are diagrams showing the waveforms of other signals to be input to the respective switches of the CMFB circuit according to Embodiment 1;

FIGS. 5A to 5D are diagrams showing the waveforms of still other signals to be input to the respective switches of the CMFB circuit according to Embodiment 1;

FIGS. 6A and 6B are waveform diagrams illustrating the operations of the respective switches in the CMFB circuits according to the present invention and the conventional CMFB circuit;

FIGS. 7A and 7B are diagrams showing the relationship between the output variation and time in the discrete time amplifier circuits according to the present invention and the conventional CMFB circuit;

FIGS. 8A and 8B are diagrams in which the convergence in the transient response state of the conventional discrete time amplifier circuit is compared with that of the discrete time amplifier circuit according to the present invention;

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

Preferred embodiments of a discrete time amplifier circuit and an analog-digital converter (hereafter simply referred to as an AD converter) incorporating the discrete time amplifier circuit according to the present invention will be described below referring to the accompanying drawings.

Embodiment 1

Figure 1:
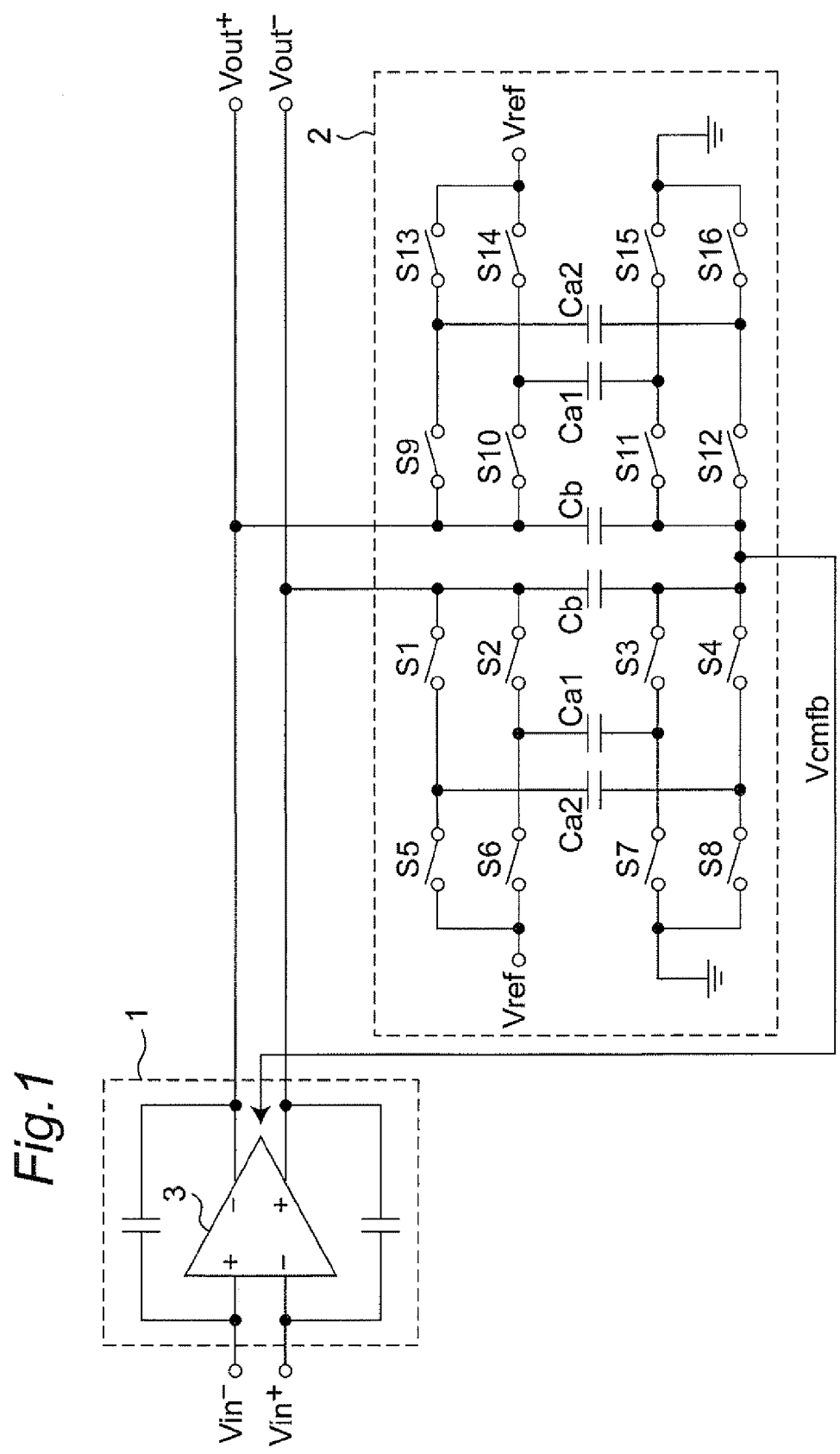
FIG. 1 is a circuit diagram showing a discrete time amplifier circuit having a discrete time common-mode feedback circuit according to Embodiment 1 of the present invention.

FIG. 1 is a circuit diagram showing a discrete time amplifier circuit having a discrete time common-mode feedback circuit according to Embodiment 1. As shown in FIG. 1, the discrete time amplifier circuit according to Embodiment 1 comprises a differential amplifier 1 for amplifying a differential signal and a discrete time common-mode feedback circuit (hereafter simply referred to as a CMFB circuit) 2 for controlling the output voltage (output common-mode voltage Vcmo) of the differential amplifier 1 to a reference voltage Vref.

The CMFB circuit 2 according to Embodiment 1 is equipped with multiple capacitors Ca1, Ca2 and Cb and multiple switches S1 to S16. The multiple capacitors of the CMFB circuit 2 include first sampling capacitors Ca1, second sampling capacitors Ca2 and hold capacitors Cb. The first sampling capacitor Ca1 and the second sampling capacitor Ca2 alternately sample a charge corresponding to the reference voltage Vref every ½ cycle. The hold capacitor Cb is connected to the input and output of the CMFB circuit 2 and configured so as to be connected in parallel with the first sampling capacitor Ca1 or the second sampling capacitor Ca2 by predetermined switching operation. The hold capacitor Cb has a function of holding the common-mode feedback voltage Vcmfb of the CMFB circuit 2.

The multiple switches S1 to S16 in the CMFB circuit 2 are configured so as to perform ON/OFF operation every ½ cycle so that the first sampling capacitor Ca1 and the second sampling capacitor Ca2 carry out sampling operation alternately every ½ cycle and so that the hold capacitor Cb holds the common-mode feedback voltage Vcmfb of the CMFB circuit 2. In the following descriptions, a mode in which a reference voltage source (Vref) is connected to a sampling capacitor Ca so that a charge is stored therein is referred to as a sampling mode, and a mode in which the current of the differential amplifier 1 is adjusted so that the reference voltage Vref, i.e., the voltage of the sampling capacitor Ca, becomes equal to the voltage of the hold capacitor Cb i.e., the output common-mode voltage Vcmo, is referred to as a hold mode. Hence, the discrete time amplifier circuit according to Embodiment 1 of the present invention is configured so that the sampling mode and the hold mode using the first sampling capacitor Ca1 and the hold mode and the sampling mode using the second sampling capacitor Ca2 are carried out alternately every ½ cycle.

Figure 2A:
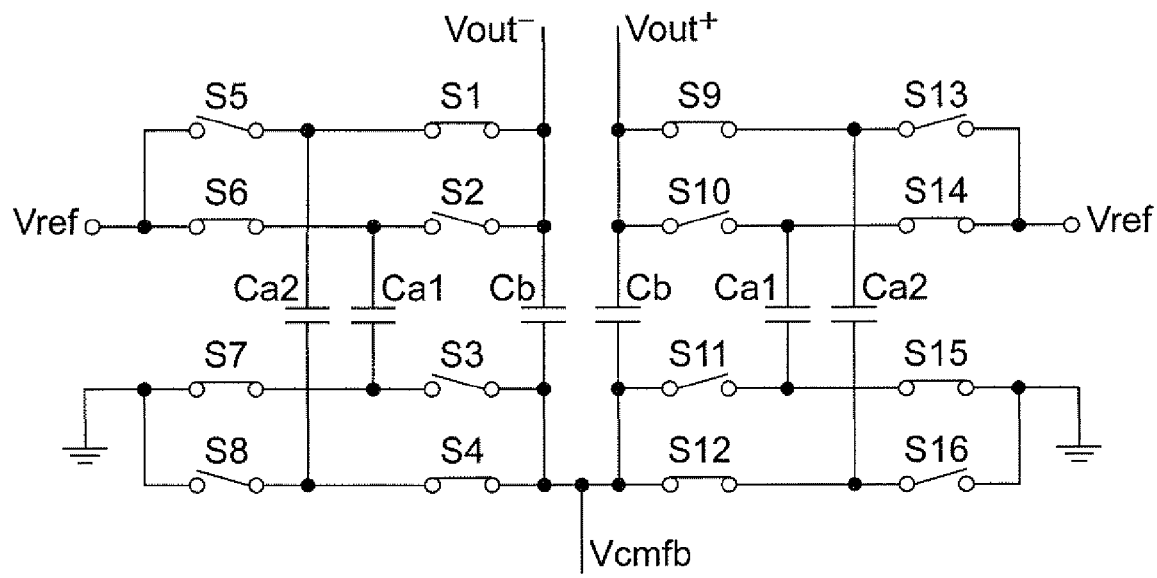
FIGS. 2A and B are circuit diagrams showing the operations of the respective switches of the CMFB circuit carried out every ½ cycle according to Embodiment 1.
Figure 2B:
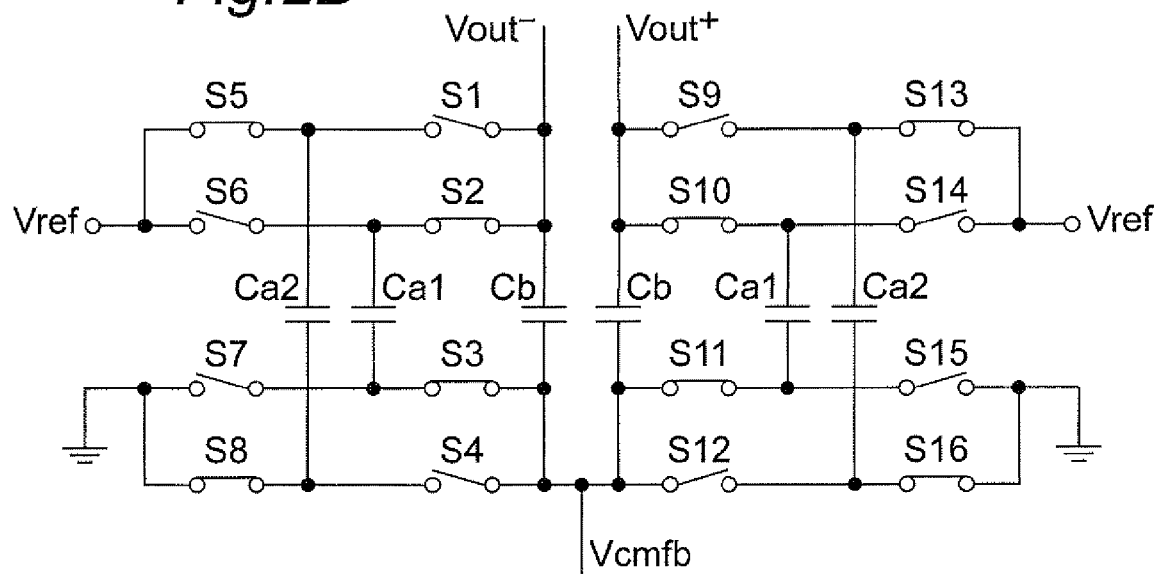

FIGS. 2A and 2B are circuit diagrams showing the operations of the switches S1 to S16 of the CMFB circuit 2 carried out every ½ cycle.

In a ½ cycle period, as shown in FIG. 2A, the switches S1, S4, S6, S7, S9, S12, S14 and S15 are ON (closed), and the switches S2, S3, S5, S8, S10, S11, S13 and S16 are OFF (open). Hence, in the ½ cycle period shown in FIG. 2A, the first sampling capacitors Ca1 are in the sampling mode, and the second sampling capacitors Ca2 are in the hold mode.

In the next ½ cycle period, as shown in FIG. 2B, the switches S1, S4, S6, S7, S9, S12, S14 and S15 are OFF (open), and the switches S2, S3, S5, S8, S10, S11, S13 and S16 are ON (closed). Hence, in the ½ cycle period shown in FIG. 2B, the first sampling capacitors Ca1 are in the hold mode, and the second sampling capacitors Ca2 are in the sampling mode.

In Embodiment 1 according to the present invention, the first sampling capacitors Ca1 and the switches S2, S3, S6, S7, S10, S11, S14 and S15 constitute a first switched-capacitor circuit, and the second sampling capacitors Ca2 and the switches S1, S4, S5, S8, S9, S12, S13 and S16 constitute a second switched-capacitor circuit.

FIGS. 3A and 3B are diagrams showing the waveforms of signals to be input to the respective switches. A signal φ1, the waveform of which is shown in FIG. 3A, is input to the switches S1, S4, S6, S7, S9, S12, S14 and S15, and a signal φ2, the waveform of which is shown in FIG. 3B, is input to the switches S2, S3, S5, S8, S10, S11, S13 and S16. As shown in FIGS. 3A and 3B, the respective switches repeat ON/OFF operations every ½ cycle, whereby the first sampling capacitors Ca1 and the second sampling capacitors Ca2 repeatedly operate in the sampling mode and in the hold mode alternately every ½ cycle.

FIGS. 4A and 4B are diagrams showing the waveforms of other signals to be input to the respective switches. A signal φ1a, the waveform of which is shown in FIG. 4A, is input to the switches S1, S4, S6, S7, S9, S12, S14 and S15, and a signal φ2a, the waveform of which is shown in FIG. 4B, is input to the switches S2, S3, S5, S8, S10, S11, S13 and S16. As shown in FIGS. 4A and 4B, a micro period during which the signals φ1a and φ2a turn OFF simultaneously is set so that the ON states of the signals do not overlap. With this setting, charge transfer between the first sampling capacitors Ca1 having sampled the reference voltage Vref at the timing of the signal φ1a and the second sampling capacitors Ca2 having sampled the reference voltage Vref at the timing of the signal φ2a can be prevented securely in the CMFB circuit 2. As a result, further error occurrence is prevented in the common-mode feedback voltage Vcmfb during operation.

In the configuration of the CMFB circuit 2 according to Embodiment 1 shown in FIG. 1, the switches that connect the first sampling capacitors Ca1 and the second sampling capacitors Ca2 to the input side of the CMFB circuit 2 may be set so as to turn OFF earlier than the switches that connect the first sampling capacitors Ca1 and the second sampling capacitors Ca2 to the output side in a ½ cycle period. More specifically, the switches that connect the first sampling capacitors Ca1 to the input side are the switches S3 and S11, and the switches that connect the second sampling capacitors Ca2 to the input side are the switches S4 and S12. In addition, the switches that connect the first sampling capacitors Ca1 to the output side are the switches S2 and S10, and the switches that connect the second sampling capacitors Ca2 to the output side are the switches S1 and S9.

FIGS. 5A to 5D are diagrams showing the waveforms of the signals that are input to the respective switches in the case that the switches that connect the first sampling capacitors Ca1 and the second sampling capacitors Ca2 to the input side of the CMFB circuit 2 are set so as to turn OFF earlier than the switches that connect the first sampling capacitors Ca1 and the second sampling capacitors Ca2 to the output side as described above. A signal $\phi 1b$, the waveform of which is shown in FIG. 5A, is input to the switches S4 and S12 that connect the second sampling capacitors Ca2 to the input side. A signal $\phi 1c$, the waveform of which is shown in FIG. 5B, is input to the switches S1 and S9 that connect the second sampling capacitors Ca2 to the output side. A signal $\phi 2b$, the waveform of which is shown in FIG. 5C, is input to the switches S3 and S11 that connect the first sampling capacitors Ca1 to the input side. A signal $\phi 2c$, the waveform of which is shown in FIG. 5D, is input to the switches S2 and S10 that connect the first sampling capacitors Ca1 to the output side.

As shown in the signal waveform diagrams of FIGS. 5A to 5D, in the hold mode in which the first sampling capacitors Ca1 and the second sampling capacitors Ca2 are used, the switches (S3, S4, S11 and S12) on the input side are set so as to turn OFF earlier than the switches (S1, S2, S9 and S10) on the input side.

The charge injection mixed on the output side can be reduced and the variation in the common-mode feedback voltage Vcmfb output from the CMFB circuit 2 can also be reduced by controlling the ON/OFF operations of the respective switches as described above. The charge injection is herein a phenomenon in which the charge stored in a switch is output to the circuit when the switch is changed from the ON state to the OFF state.

In the signal waveforms shown in FIGS. 5A to 5D, the sampling mode and the hold mode, in which the first sampling capacitors Ca1 are used, are set so as not to overlap. Similarly, the sampling mode and the hold mode, in which the second sampling capacitors Ca2 are used, are set so as not to overlap. For example, as shown in FIGS. 5A to 5D, a micro period during which the signals $\phi 1b$ and $\phi 2b$ turn OFF simultaneously is set so that the ON states of the signals do not overlap, and another micro period during which the signals $\phi 1c$ and $\phi 2c$ turn OFF simultaneously is set so that the ON states of the signals do not overlap. This setting produces an effect similar to that obtained in the signal waveforms shown in FIGS. 4A and 4B described earlier and prevents error occurrence in the common-mode feedback voltage Vcmfb.

Next, the effect of the discrete time amplifier circuit according to Embodiment 1 of the present invention configured as described above will be described below.

FIGS. 6A and 6B are diagrams showing the waveforms of the signals ($\phi 1$ and $\phi 2$) to be input to the respective switches and the output common-mode voltage (Vcmo) in the CMFB circuit of the discrete time amplifier circuit. FIG. 6A shows the timing relationship between the signals $\phi 1$ and $\phi 2$ to be input to the respective switches and the output common-mode voltage Vcmo in the configuration of the conventional discrete time CMFB circuit (single sampling). FIG. 6B shows the timing relationship between the signals $\phi 1$ and $\phi 2$ to be input to the respective switches and the output common-mode voltage Vcmo in the configuration of the CMFB circuit 2 according to Embodiment 1.

Since the conventional discrete time CMFB circuit shown in FIG. 6A is a single sampling type, the circuit goes into the sampling mode when the signal $\phi 1$ is ON and goes into the hold mode when the signal $\phi 2$ is ON, for example. Hence, the feedback gain (loop gain) of the conventional discrete time CMFB circuit changes every ½ cycle. As a result, in the conventional discrete time CMFB circuit, under the double sampling condition in which the input amplitude of the differential amplifier changes every ½ cycle, the output common-mode voltage Vcmo varies by a voltage ΔVcmo corresponding to the change in the feedback gain every ½ cycle.

On the other hand, since the CMFB circuit 2 according to Embodiment 1 shown in FIG. 6B is a double sampling type, the first switched-capacitor circuit goes into the sampling mode and the second switched-capacitor circuit goes into the hold mode when the signal $\phi 1$ is ON and the signal $\phi 2$ is OFF, for example. Hence, the feedback gain does not change substantially every ½ cycle. Since the CMFB circuit 2 according to Embodiment 1 operates in the hold mode and the sampling mode in each ½ cycle as described above, the output common-mode voltage Vcmo does not vary.

FIGS. 7A and 7B are diagrams showing the relationship between the output variation and time in the differential amplifier. FIG. 7A shows the output variation (ΔVout+ΔVcmo) in the output Vout of the differential amplifier in the case that the conventional discrete time CMFB circuit (single sampling) is used. In this case, the hold mode is selected when the signal $\phi 2$ is ON, and the output Vout is adjusted. FIG. 7B shows the output variation (ΔVout) in the output Vout of the discrete time amplifier circuit according to Embodiment 1.

As shown in FIG. 7A, in the differential amplifier circuit in the case that the conventional discrete time CMFB circuit is used and in the hold mode at the time when the signal $\phi 2$ is ON, the output common-mode voltage Vcmo varies by ΔVcmo in comparison with the voltage in the sampling mode as shown in FIG. 6A, and the settling time becomes long. Hence, as shown in FIG. 7A, under a high clock operation condition and in the preset hold mode period, there occurs a case in which the convergence time serving as the settling time becomes insufficient by ΔT. As a result, in the amplifier circuit in the case that the conventional discrete time CMFB circuit is used, there is a problem in which distortion and noise characteristics deteriorate.

In the discrete time amplifier circuit according to Embodiment 1 of the present invention, the output common-mode voltage Vcmo does not vary substantially as shown in FIG. 6B. Hence, the settling time is securely maintained within the hold mode period even under a high clock operation condition. As a result, the problem in which the distortion and noise characteristics deteriorate is solved.

FIGS. 8A and 8B are diagrams in which the convergence (FIG. 8A) in the transient response state of the discrete time amplifier circuit in the case that the conventional discrete time CMFB circuit (single sampling) is used is compared with the convergence (FIG. 8B) in the transient response state of the discrete time amplifier circuit (double sampling) according to Embodiment 1.

As shown in FIGS. 8A and 8B, in the discrete time amplifier circuit according to Embodiment 1, the hold mode is repeated every ½ cycle, and the convergence time is remarkably shortened in comparison with that of the conventional amplifier circuit (single sampling). Hence, in the discrete time amplifier circuit according to Embodiment 1, the convergence in the transient state is improved remarkably, and the return time from the transient response state to the steady state can be shortened outstandingly.

As described above, in the discrete time amplifier circuit according to Embodiment 1 of the present invention, the switched-capacitor CMFB circuit thereof is configured so as to perform double sampling. Hence, the characteristics (distortion and noise characteristics) of the amplifier circuit are improved remarkably. In addition, since the CMFB circuit is configured so as to operate every ½ cycle, the return time from the transient response state to the steady state is shortened outstandingly.

The discrete time amplifier circuit according to Embodiment 1 is provided with the first switched-capacitor circuit comprising the first sampling capacitors Ca1 and the switches S2, S3, S6, S7, S10, S11, S14 and S15; the second switched-capacitor circuit comprising the second sampling capacitors Ca2 and the switches S1, S4, S5, S8, S9, S12, S13 and S16; and a common-mode feedback voltage generating circuit comprising the hold-mode capacitors Cb, and is configured such that the common-mode feedback voltage generating circuit is shared by the first switched-capacitor circuit and the second switched-capacitor circuit. Hence, the amplifier circuit is simplified in comparison with the amplifier circuit in which a double sampling CMFB circuit is configured using two single sampling CMFB circuits.

The CMFB circuit 2 in the discrete time amplifier circuit according to Embodiment 1 may be configured so that the switches are formed of a MOS transistor and so that the MOS transistor has a dummy switch.

Figure 9:
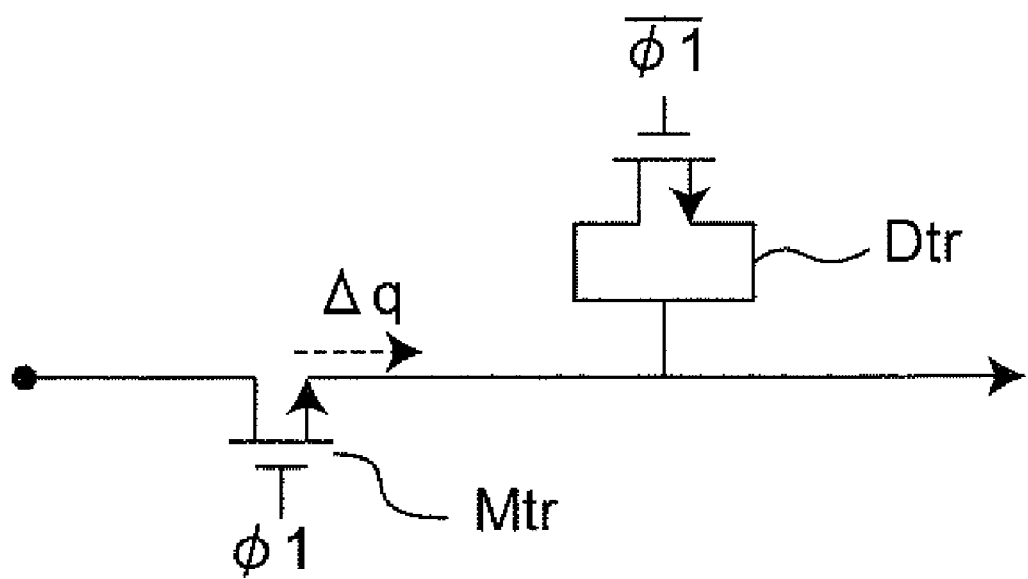
FIG. 9 is a circuit diagram showing a specific example of the switches of the CMFB circuit according to Embodiment 1.

FIG. 9 is a circuit diagram showing a specific example of the switches of the CMFB circuit 2 according to Embodiment 1. As shown in FIG. 9, the switches are each formed of two nMOS transistors (Mtr and Dtr). One of the nMOS transistors, i.e., a first nMOS transistor Mtr, serves as a switch that turns ON/OFF depending on a signal (for example, the signal φ1), and the other nMOS transistor, i.e., a second nMOS transistor Dtr, serves as a dummy switch. The size of the second nMOS transistor Dtr serving as a dummy switch is half the size of the first nMOS transistor Mtr.

As shown in FIG. 9, the drain and the source of the second nMOS transistor Dtr are connected to the output of the first nMOS transistor Mtr. In addition, the voltage of the signal to be input to the gate of the second nMOS transistor Dtr is in reverse phase with the voltage of the signal to be input to the gate of the first nMOS transistor Mtr.

With this configuration of the switches of the CMFB circuit, the charge Δq caused by charge injection and output when the first NMOS transistor Mtr turns OFF is absorbed in the source and the drain of the second nMOS transistor Dtr that serves as a dummy switch and turns ON when the first nMOS transistor Mtr turns OFF, wherein the charge Δq/2 is absorbed in each of the source and the drain of the second nMOS transistor Dtr. As a result, the charge that is output when the switch turns OFF does not flow into the circuit, whereby the variation in the output of the CMFB circuit is suppressed and highly accurate feedback can be carried out.

Furthermore, in the CMFB circuit 2 in the discrete time amplifier circuit according to Embodiment 1, the switches of the first switched-capacitor circuit and the second switched-capacitor circuit may also be formed of a CMOS transistor. In the case that the switches are formed of a CMOS transistor, the resistance value during switch operation can be reduced in comparison with the case that the switches are formed of only an nMOS transistor or a PMOS transistor. Hence, the configuration has an effect of improving the performance of the CMFB circuit so that the output thereof is not changed by the distortion and noise caused by the nonlinearity of the switch.

Moreover, in the CMFB circuit 2 in the discrete time amplifier circuit according to Embodiment 1, the capacitors of the switched-capacitor circuits may be formed of wires and insulators.

Generally speaking, MIM (Metal-Insulator-Metal) capacitors, MOM (Metal-Oxide-Metal) capacitors, etc. are available as capacitors formed of wires and insulators. The variations in the capacitance values of these capacitors can be made smaller than the variations in the capacitance values of ordinary capacitors. Hence, the capacitors produce an effect capable of improving the performance of the CMFB circuit so that the variation in the output voltage of the CMFB circuit owing to the variation in the closed-loop gain of the CMFB circuit is made smaller.

The double sampling discrete time amplifier circuit has been described in the above-mentioned Embodiment 1. In addition, with the use of the double sampling discrete time amplifier circuit for an AD converter, it is possible to construct an AD converter being simple in circuit configuration and featuring low current consumption. Since the distortion and noise characteristics of the differential amplifier are improved, a highly accurate AD converter is obtained, and the AD converter can be provided as a highly versatile device.

Embodiment 2

A discrete time amplifier circuit and an AD converter incorporating the discrete time amplifier circuit according to Embodiment 2 of the present invention will be described below referring to the accompanying drawings.

Figure 10:
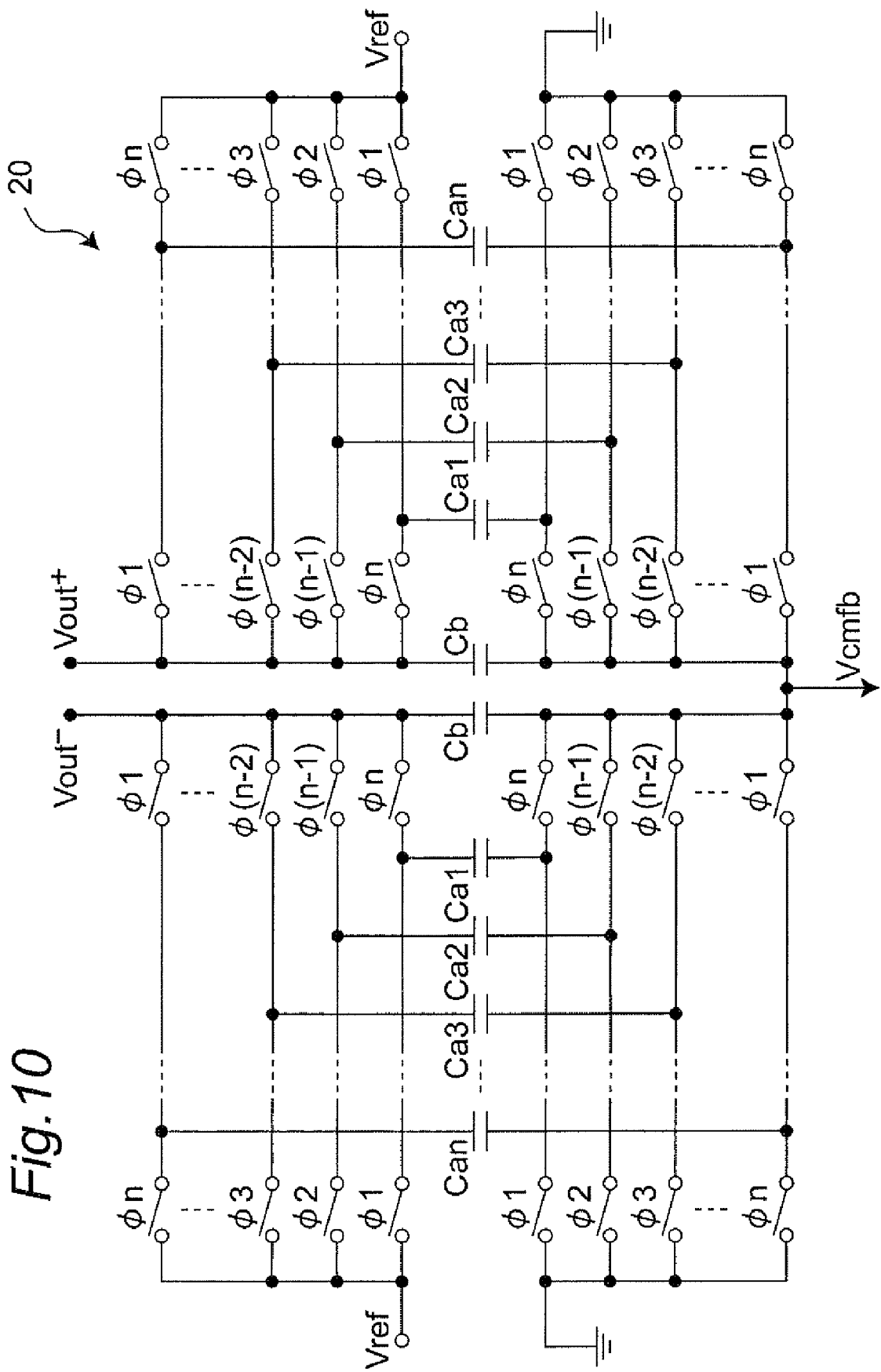
FIG. 10 is a circuit diagram showing a CMFB circuit in a discrete time amplifier circuit according to Embodiment 2 of the present invention.

FIG. 10 is a circuit diagram showing a common-mode feedback circuit (hereafter simply referred to as a CMFB circuit) 20 in the discrete time amplifier circuit according to Embodiment 2 of the present invention. As shown in FIG. 10, the CMFB circuit 20 according to Embodiment 2 is provided with multiple sampling capacitors Ca1, Ca2, Ca3, . . . , Can, two hold capacitors Cb and multiple switches. The multiple switches are switches that connect the capacitors Ca1, Ca2, Ca3, . . . , Can to the input and output sides of the CMFB circuit 20 and switches that connect the capacitors to the side of the reference voltage (Vref). Furthermore, the hold capacitors Cb are connected to the input and output sides of the CMFB circuit 20 and further connected in parallel with the sampling capacitors Ca1, Ca2, Ca3, . . . , Can by the predetermined switching of the switches. The hold capacitors Cb have a function of holding the common-mode feedback voltage Vcmfb as in the case of the discrete time amplifier circuit according to the above-mentioned Embodiment 1.

Figure 11:
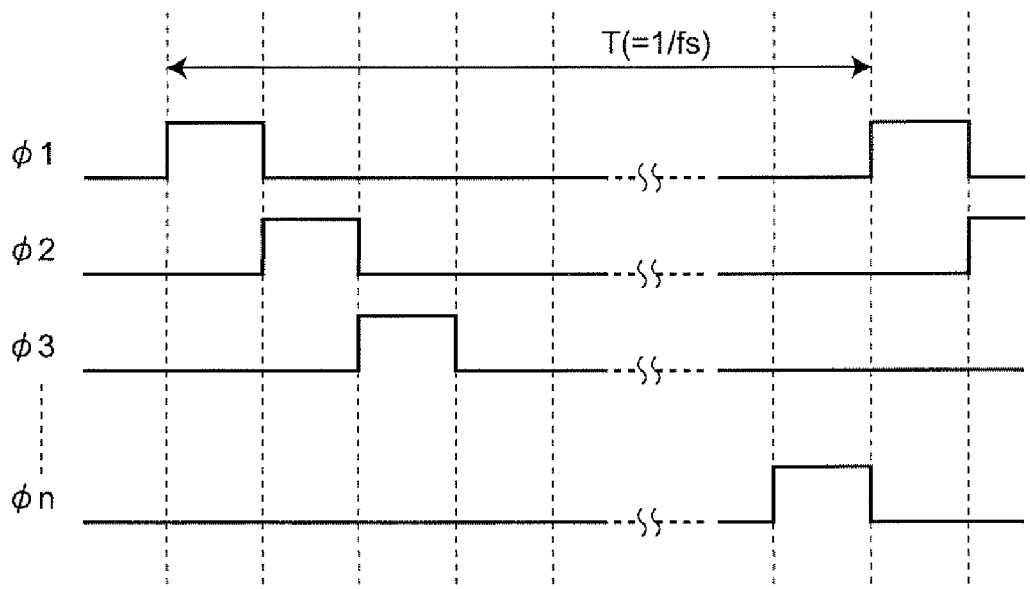
FIG. 11 is a diagram showing the waveforms of signals to be input to the respective switches of the CMFB circuit according to Embodiment 2.

FIG. 11 shows the waveforms of signals (φ1, φ2, φ3, . . . , φn) to be input to the respective switches, and the signals are input to the switches shown in FIG. 10 and corresponding to the signals. More specifically, the signal φn is input to the switches that connect the capacitors Ca1 to the input and output sides of the CMFB circuit 20, and the signal φ1 is input to the switches that connect the capacitors Ca1 to the side of the reference voltage (Vref).

In the CMFB circuit 20 according to Embodiment 2, as shown in the signal waveform diagrams of FIG. 11, one cycle is divided into n segments. The CMFB circuit 20 is configured so that the switches turn ON/OFF at timing synchronized with a sampling clock having a duty ratio of 1/n. In other words, the CMFB circuit 20 goes into the sampling mode in which the capacitors Ca1, Ca2, Ca3, ..., Can are sequentially connected to the side of the reference voltage Vref and then the hold mode in which the capacitors Can, Ca(n−1), Ca(n−2), ..., Ca1 are sequentially connected to the input and output sides every 1/n cycle. Hence, in the CMFB circuit 20 according to Embodiment 2, the hold capacitors Cb serving as the common-mode feedback voltage generating circuit for holding the common-mode feedback voltage Vcmfb are sequentially charged with the charges of the capacitors Can, Ca(n−1), Ca(n−2), ..., Ca1. Therefore, the discrete time amplifier circuit according to Embodiment 2 becomes a circuit having an n-sampling discrete time CMFB circuit.

Furthermore, in the CMFB circuit 20 according to Embodiment 2, the sampling capacitors Ca1, Ca2, Ca3, ..., Can may have different capacitances. In other words, it may also be possible to have a configuration in which the gain of the hold mode circuit switched using the switches changes so that the feedback gain changes sequentially. For example, the gain in the hold mode in a one cycle period is set so as to become smaller gradually every 1/n cycle. The capacitance of the capacitor Can that goes into the hold mode in the initial stage of one cycle becomes maximum, and the capacitance of the capacitor Ca1 that goes into the hold mode in the final stage becomes minimum. However, in consideration of the stray capacitance of the circuit in the final stage, it is preferable that the capacitance of the capacitor Ca1, becoming minimum, should be set 10 or more times the stray capacitance of the circuit. If the capacitance of the capacitor Ca1, becoming minimum, is set less than 10 times the stray capacitance of the circuit, the function in the hold mode is not performed, and the feedback circuit becomes unstable in some cases.

If the capacitances of the respective sampling capacitors Ca1, Ca2, Ca3, ..., Can are the same as the capacitance of the sampling capacitor Ca1 having a large feedback gain in the initial stage, the convergence of the output variation becomes faster. However, there is a problem in which ringing occurs in the voltage input to the main amplifier 2 even in the sampling capacitor Can in the final stage and the voltage becomes unstable.

On the other hand, if the capacitances of the respective sampling capacitors Ca1, Ca2, Ca3, ..., Can are the same as the capacitance of the sampling capacitor Can having a small feedback gain in the initial stage, the voltage input to the main amplifier 2 becomes stable and has a constant value. However, the convergence of the output variation becomes slower, and there is a problem in which the settling time increases.

Hence, the sampling mode and the hold mode are repeated n times in a ½ cycle, and the sampling capacitance is changed so that the feedback gain is changed from a large value to a small value. Hence, the convergence in the sampling capacitor in the initial stage can be made faster, and the voltage input to the main amplifier 2 in the sampling capacitor Can in the final stage can be stabilized.

Since the discrete time amplifier circuit according to Embodiment 2 has the n-sampling discrete time CMFB circuit 20 as described above, the discrete time amplifier circuit has a configuration capable of carrying out highly accurate control. Hence, the discrete time amplifier circuit according to Embodiment 2 has an excellent effect capable of accelerating the convergence and stabilizing the voltage input to the main amplifier.

The double sampling discrete time amplifier circuit has been described in the above-mentioned Embodiment 2. In addition, with the use of the double sampling discrete time amplifier circuit for an AD converter, it is possible to construct an AD converter being simple in circuit configuration and featuring low current consumption. Since the distortion and noise characteristics of the differential amplifier are improved, a highly accurate AD converter is obtained, and the AD converter can be provided as a highly versatile device.

Embodiment 3

A discrete time amplifier circuit and an AD converter incorporating the discrete time amplifier circuit according to Embodiment 3 of the present invention will be described below referring to the accompanying drawings.

Figure 12:
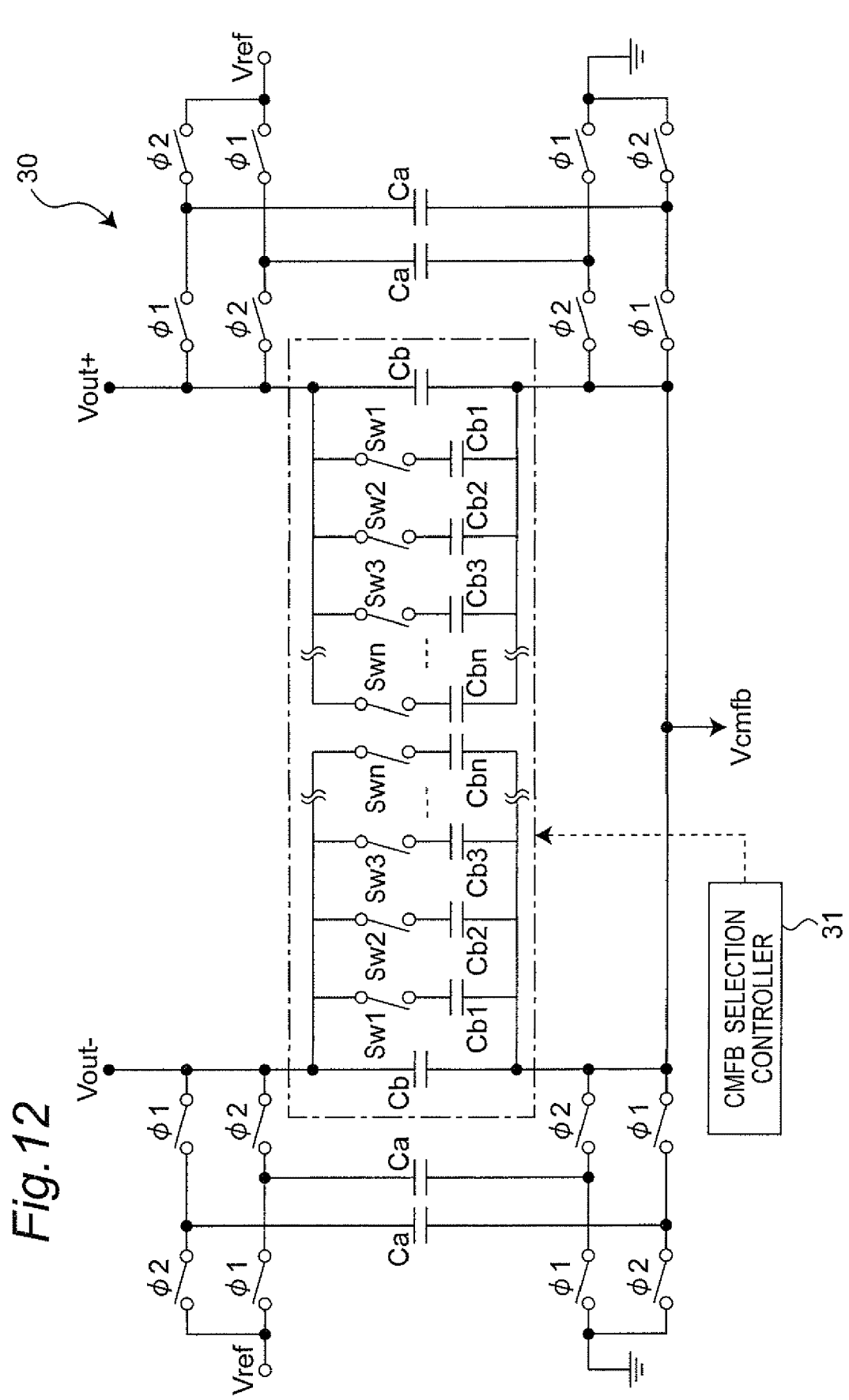
FIG. 12 is a circuit diagram showing a CMFB circuit in a discrete time amplifier circuit according to Embodiment 3 of the present invention.

FIG. 12 is a circuit diagram showing a common-mode feedback circuit (hereafter simply referred to as a CMFB circuit) 30 in the discrete time amplifier circuit according to Embodiment 3 of the present invention. As shown in FIG. 12, multiple hold capacitors serving as a common-mode feedback voltage generating circuit for generating and holding the common-mode feedback voltage are formed in the CMFB circuit 30. In other words, hold capacitors Cb1, Cb2, Cb3, ..., Cbn are connected to the input and output terminals of the CMFB circuit 30 via switches Sw1, Sw2, Sw3, ..., Swn, respectively. The capacitance values of the hold capacitors Cb1, Cb2, Cb3, ..., Cbn are set at different values, and either one of the hold capacitors Cb1, Cb2, Cb3, ..., Cbn can be specified by the switching of the switches Sw1, Sw2, Sw3, ..., Swn.

The CMFB circuit 30 in the discrete time amplifier circuit according to Embodiment 3 is provided with a CMFB selection controller 31 and is configured so that the hold capacitor to be used is selected using the CMFB selection control signal from the CMFB selection controller 31.

In the CMFB circuit 30 according to Embodiment 3, the capacitances of the hold capacitors Cb1, Cb2, Cb3, ..., Cbn are different from one another, the loop gain, that is, the feedback gain, of the CMFB circuit 30 can be switched using the switches Sw1, Sw2, Sw3, ..., Swn. Hence, the return time from the transient response state to the steady state can be shortened and the convergence can be accelerated by switching the loop gain of the CMFB circuit 30. The loop gain of the CMFB circuit 30 is set high in the initial stage of the transient response state so as to become lower gradually and is set lowest in the steady state. In consideration of the stray capacitance of the circuit in the final stage, it is preferable that the loop gain value in the final stage of the transient response state should be set 10 or more times the stray capacitance of the circuit. If the capacitance of the capacitor Cb1, becoming minimum, is set less than 10 times the stray capacitance of the circuit, the output variation (ΔVcmo) serving as the error voltage between the reference voltage (Vref) and the output common-mode voltage (Vcmo) of the main amplifier 2 is input as the combination of the capacitance of the hold capacitor and the stray capacitance, the feedback gain lowers and the stability deteriorates. For example, in the case that the stray capacitance equivalent to the capacitance of the hold capacitor is present at the output terminal of the hold capacitor, the feedback of the variation output to the main amplifier 2 is halved. In addition, since the stray capacitance is generally grounded to the ground serving as a lower electrode, the noise voltage superimposed on the ground is also halved and input to the main amplifier 2, and the stability further deteriorates.

The following describes the reason why the convergence from the transient response state to the steady state is improved by changing the loop gain as described above.

The output common-mode voltage Vcmo from the discrete time amplifier circuit is represented by Formula 1 described below.

$$Vcmo = (Vout+ + Vout-)/2 \quad (1)$$

Furthermore, the variation ΔVcmfb of the common-mode feedback voltage Vcmfb in each of the sampling mode and the hold mode is represented by Formula 2 described below.

$$\Delta Vcmfb = (Ca/(Ca+Cb)) \cdot (Vcmo - Vref) \quad (2)$$

wherein Ca designates a sampling capacitor being used for the circuit, Cb designates a hold capacitor being used for the circuit, and Vref designates the reference voltage.

The feedback gain Gfb(=Ca/(Ca+Cb)) for ensuring stability in the steady state is set low. However, in the case that the feedback gain Gfb is also low in the transient response state, there is a problem in which the return time to the steady state becomes long.

Next, for example, the case in which Ca=Cb/4 is established and the feedback gain Gfb is set low and the case in which Ca=Cb is established and the feedback gain Gfb is set high, Gfb=0.5, will be described below.

Figure 13A:
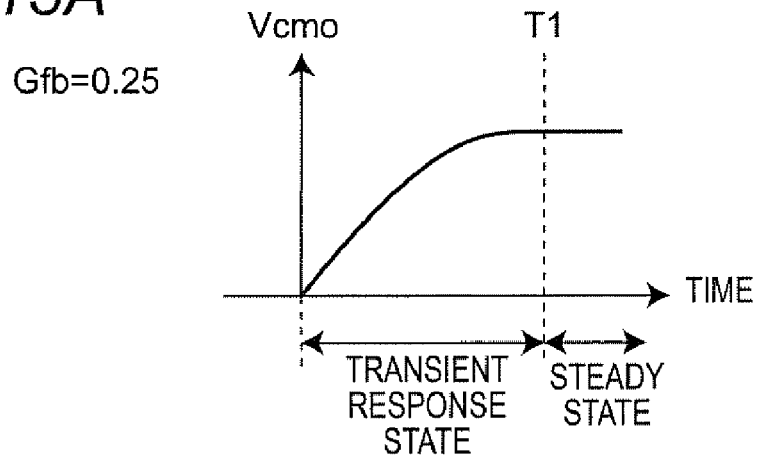
FIGS. 13A to 13C are graphs showing the states of the output common-mode voltage Vcmo in the case that the feedback gain Gfb of the CMFB circuit is changed in the transient response state.
Figure 13B:
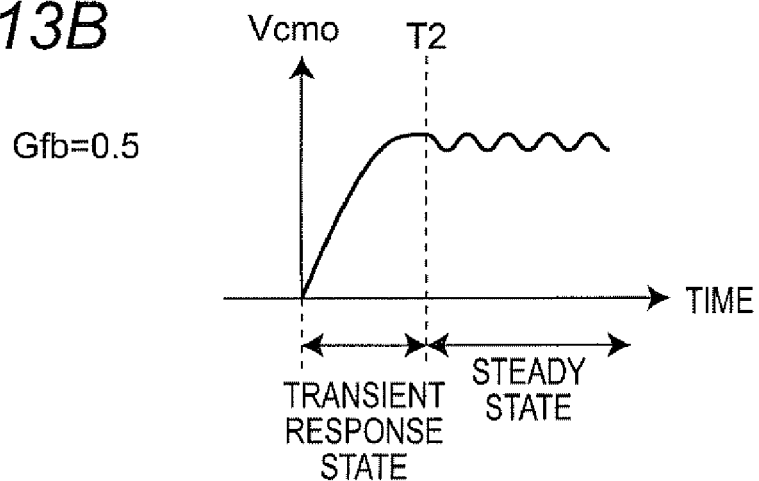
Figure 13C:
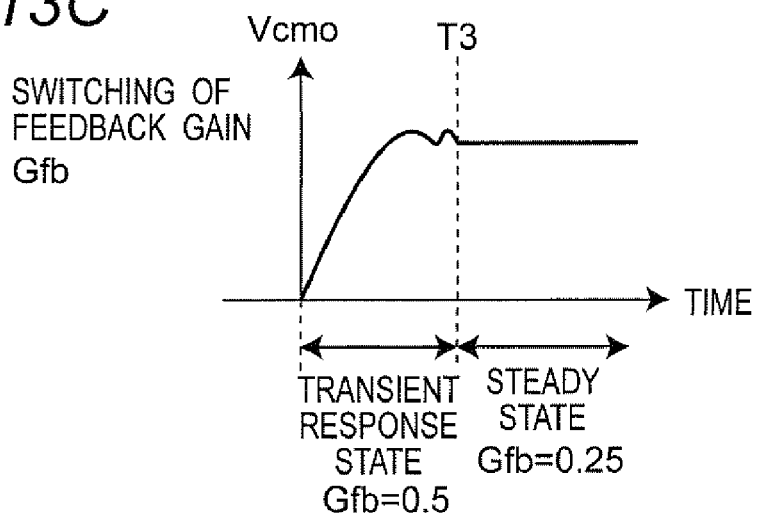

FIGS. 13A to 13C are graphs showing the states of the output common-mode voltage Vcmo in the case that the feedback gain Gfb of the CMFB circuit is changed. FIG. 13A is a graph in the case that the feedback gain Gfb is set at 0.25, and FIG. 13B is a graph in the case that the feedback gain Gfb is set at 0.5. FIG. 13C is a graph in the case that the feedback gain Gfb is set at 0.5 in the transient response state and set at 0.25 at the steady state. In FIGS. 13A, 13B and 13C, the return time value T1, T2 and T3 from the transient response state to the steady state have a relationship of T1>T3>T2, and the return time value in the case of FIG. 3C is shortest.

When the feedback gain is set low, Gfb=0.25, as shown in FIG. 13A, the voltage is shifted stably from the transient response state to the steady state; however, the return time is longer than that in the case that the feedback gain Gfb is 0.5 shown in FIG. 13B. On the other hand, in the case that the feedback gain Gfb is 0.5, the return time becomes shorter but there occurs a problem in which the voltage becomes unstable in the steady state.

When the feedback gain is set high, Gfb=0.5, in the transient response state and then set low, Gfb=0, in the steady state as shown in FIG. 13C, the shortening of the return time and the stability in the steady state can be attained.

In the CMFB circuit 30 in the discrete time amplifier circuit according to Embodiment 3, the feedback gain of the CMFB circuit may be set so as to be switched in synchronization with the switching ON timing of the power source of the amplifier circuit so that the feedback gain becomes lower gradually at preset time intervals. This setting has an effect capable of shortening the convergence time required until the amplifier circuit is stabilized from the transient response sate to the steady state while the amplifier circuit is ON.

The double sampling discrete time amplifier circuit has been described in the above-mentioned Embodiment 3. In addition, with the use of the double sampling discrete time amplifier circuit for an AD converter, it is possible to attain the shortening of the return time from the transient response state to the steady state and the stability in the steady state, and an AD converter having high reliability can be provided.

Embodiment 4

A discrete time amplifier circuit and an AD converter incorporating the discrete time amplifier circuit according to Embodiment 4 of the present invention will be described below referring to the accompanying drawings.

Figure 14:
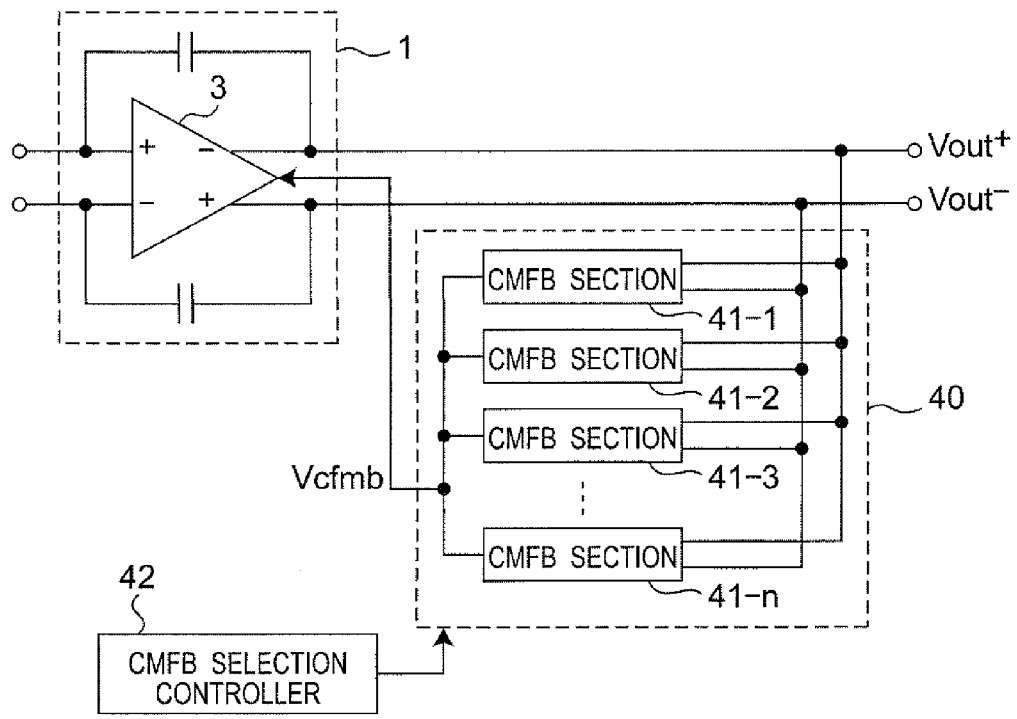
FIG. 14 is a schematic block diagram showing the configuration of a discrete time amplifier circuit according to Embodiment 4 of the present invention.

FIG. 14 is a schematic block diagram showing the configuration of the discrete time amplifier circuit according to Embodiment 4 of the present invention. In the discrete time amplifier circuit according to Embodiment 4, a common-mode feedback circuit (hereafter simply referred to as a CMFB circuit) 40 has multiple CMFB sections 41-1, 41-2, 41-3, . . . , 41-n and a CMFB selection controller 42. The discrete time amplifier circuit according to Embodiment 4 is configured so that the desired CMFB section is selected from among the CMFB sections 41-1, 41-2, 41-3, . . . , 41-n having different feedback gains using the CMFB selection control signal output from the CMFB selection controller 42.

In the discrete time amplifier circuit according to Embodiment 4, as described in the above-mentioned Embodiment 3, an appropriate feedback gain can be selected, by switching, to shorten the return time from the transient response state to the steady state and to ensure stability in the steady state. Also in the CMFB circuit 40 according to Embodiment 4, the feedback gain is set high in the initial stage of the transient response state so as to become lower gradually and is set lowest in the steady state. Hence, the discrete time amplifier circuit according to Embodiment 4 has an effect similar to that obtained in the discrete time amplifier circuit according to the above-mentioned Embodiment 3. In addition, the switching operation can be carried out stably and securely using the multiple CMFB sections provided in the amplifier circuit.

The double sampling discrete time amplifier circuit has been described in the above-mentioned Embodiment 4. In addition, with the use of the double sampling discrete time amplifier circuit for an AD converter, it is possible to attain the shortening of the return time from the transient response state to the steady state and the stability in the steady state, and an AD converter having high reliability can be provided.

Embodiment 5

A discrete time amplifier circuit and an AD converter incorporating the discrete time amplifier circuit according to Embodiment 5 of the present invention will be described below referring to the accompanying drawings.

Figure 15:
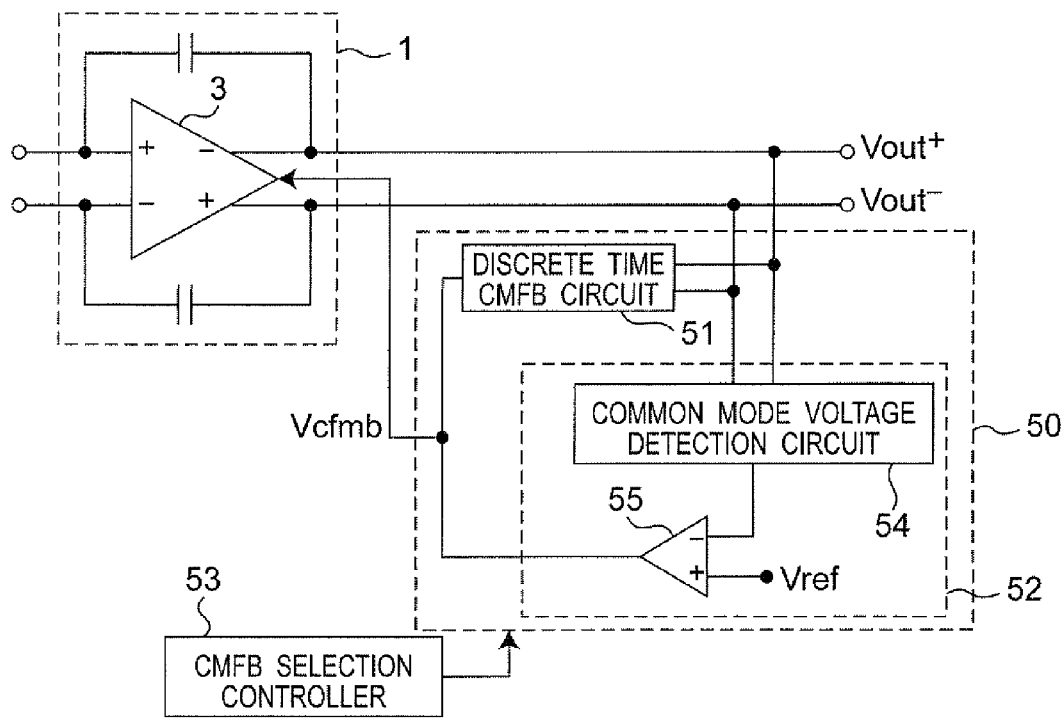
FIG. 15 is a schematic block diagram showing the configuration of a discrete time amplifier circuit according to Embodiment 5 of the present invention.

FIG. 15 is a schematic block diagram showing the configuration of the discrete time amplifier circuit according to Embodiment 5 of the present invention. In the discrete time amplifier circuit according to Embodiment 5, a common-mode feedback circuit (hereafter simply referred to as a CMFB circuit) 50 has a discrete time CMFB circuit and a continuous time CMFB circuit. Either one of the CMFB circuits is selected using the CMFB selection controller.

As shown in FIG. 15, the CMFB circuit 50 according to Embodiment 5 comprises a discrete time CMFB circuit 51, a continuous time CMFB circuit 52 and a CMFB selection controller 53. The CMFB circuits (2, 20, 30 and 40) described in the above-mentioned Embodiments 1 to 4 are applicable to the discrete time CMFB circuit 51 according to Embodiment 5. The continuous time CMFB circuit 52 comprises a common mode voltage detection circuit 54 and an operational amplifier 55, and a continuous time CMFB circuit generally used is applicable to the continuous time CMFB circuit 52.

The discrete time amplifier circuit according to Embodiment 5 uses the continuous time CMFB circuit 52 being excellent in convergence and the discrete time CMFB circuit 51 featuring low current consumption and being excellent in distortion and noise characteristics, and either one of them is selected appropriately to enhance the convergence in the transient response state and to ensure the stability in the steady state. It is thus possible to provide an amplifier circuit and an AD converter being high in reliability.

Embodiment 6

An AD converter incorporating a discrete time amplifier circuit according to Embodiment 6 of the present invention will be described below referred to the accompanying drawings.

Figure 16:
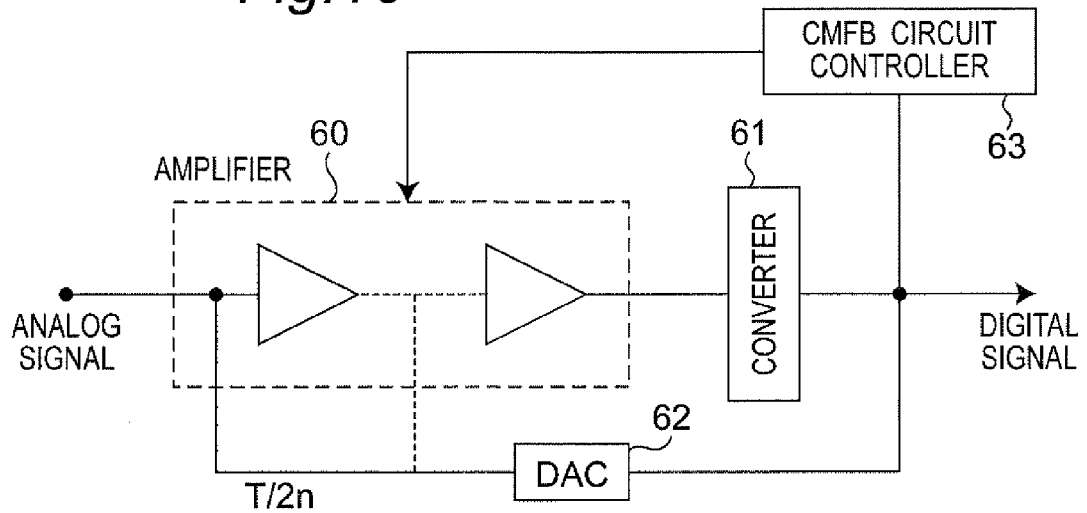
FIG. 16 is a schematic block diagram showing the configuration of an AD converter according to Embodiment 6 of the present invention.

FIG. 16 is a schematic block diagram showing the configuration of the AD converter according to Embodiment 6 of the present invention. The AD converter according to Embodiment 6 comprises an amplifier 60, a comparator 61, a DA converter (DAC) 62 and a common-mode feedback circuit controller (hereafter referred to as a CMFB circuit controller) 63.

The AD converter according to Embodiment 6 is configured so that the transition to the steady state of the amplifier circuit is accelerated and the AD converter is quickly returned to the steady state in the case that the state of the analog signal is returned from the saturated state at the time of excessive analog input.

The CMFB circuit controller 63 of the AD converter according to Embodiment 6 has a saturated state detection circuit that detects that the analog input signal is in the saturated state when the detection circuit detects that the digital output signal of the AD converter has reached its maximum or minimum for a preset continuous period or longer. Upon detecting that the analog input signal is in the saturated state, the saturated state detection circuit selects a CMFB circuit having an appropriate feedback gain from among the multiple CMFB circuits provided in the amplifier circuit and activates the selected CMFB circuit. Furthermore, in the steady state in which the saturated state detection circuit detects that the analog input signal has returned from the saturated state, the saturated state detection circuit selects a CMFB circuit having an appropriate feedback gain and activates the selected CMFB circuit.

Figure 17:
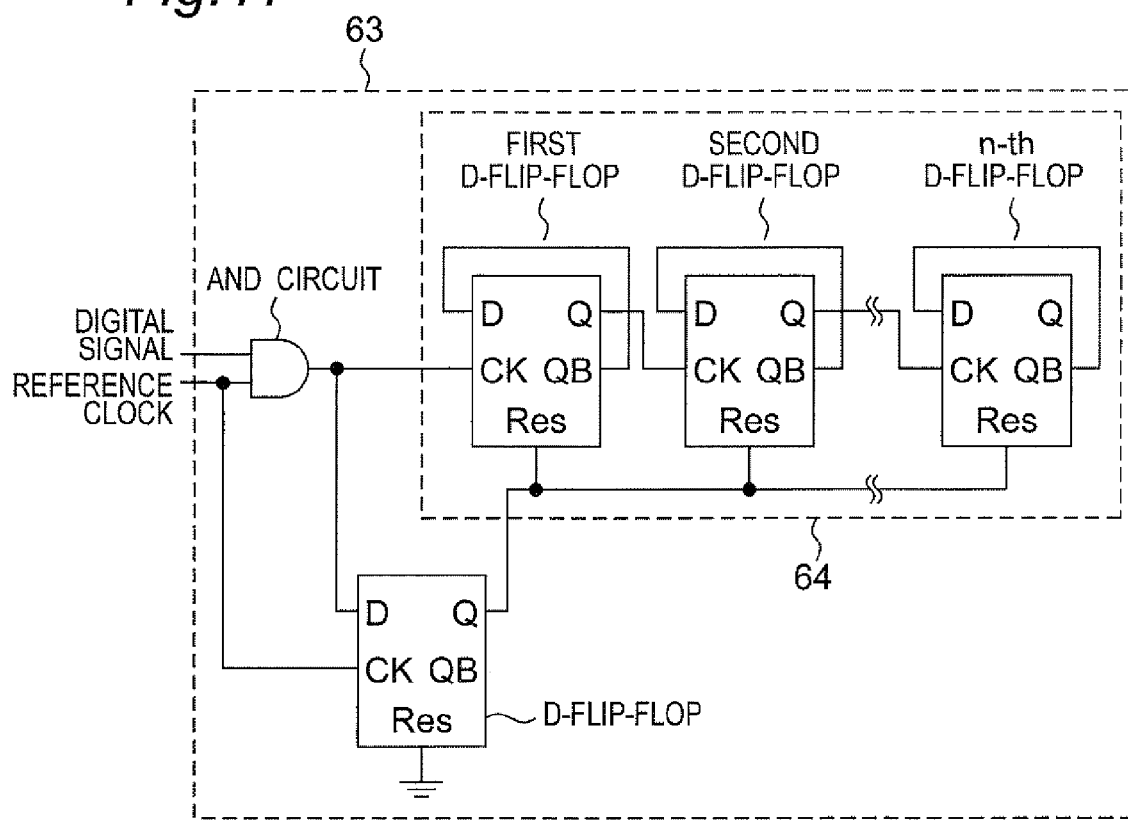
FIG. 17 is a block diagram showing the configuration of the CMFB circuit controller of the AD converter according to Embodiment 6.

The saturated state detection circuit of the CMFB circuit controller 63 is formed of a counter. Although various kinds of counters, such as asynchronous/synchronous counters and counters conforming to various systems, are available as the counter, the saturated state detection circuit according to Embodiment 6 is formed of a counter detecting the n-th power of 2 and comprising n D-flip-flop circuits connected in cascade. FIG. 17 is a block diagram showing the configuration of the CMFB circuit controller 63 of the AD converter according to Embodiment 6.

Figure 18:
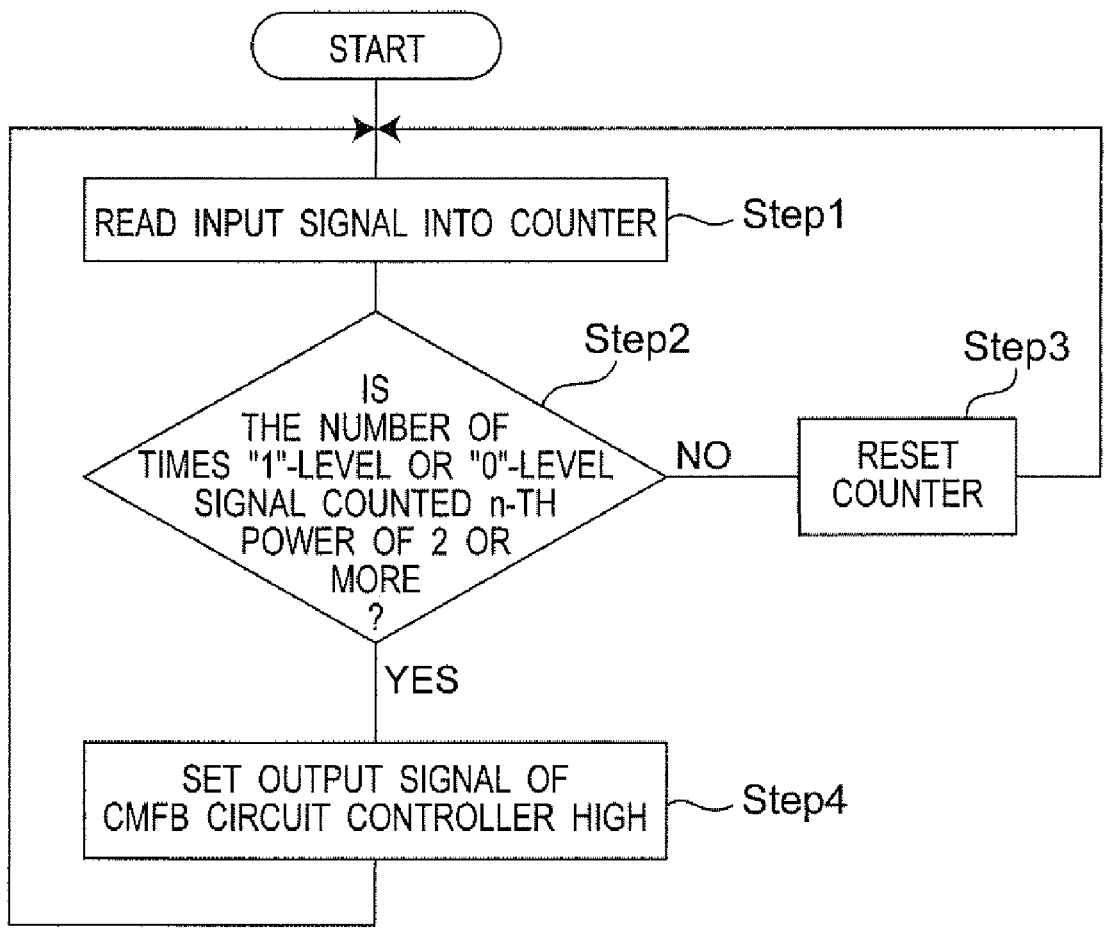
FIG. 18 is a flowchart showing the operation of the CMFB circuit controller of the AD converter according to Embodiment 6.
Figure 19:
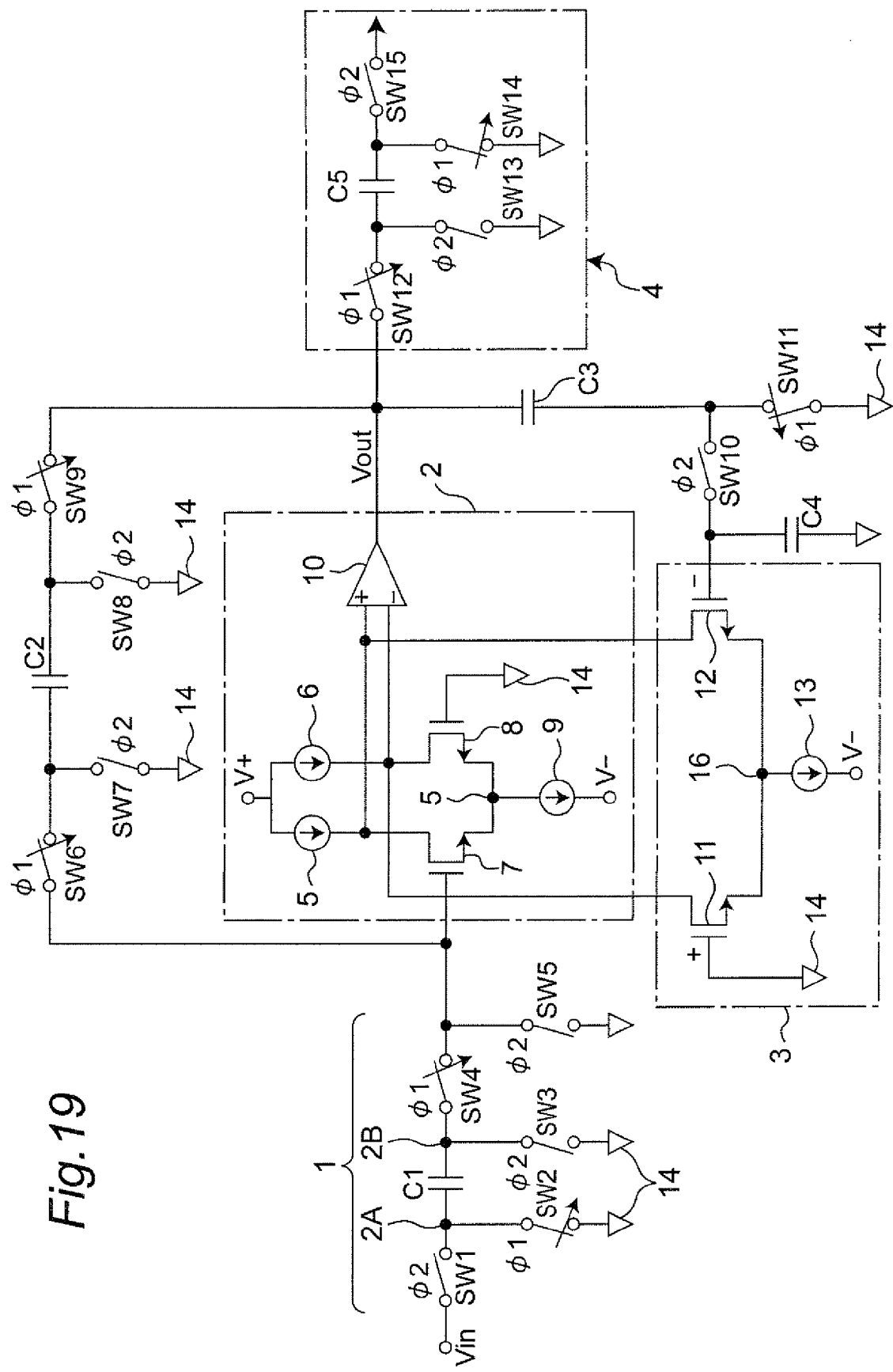
FIG. 19 is a circuit diagram of the conventional amplifier circuit.
Figure 20:
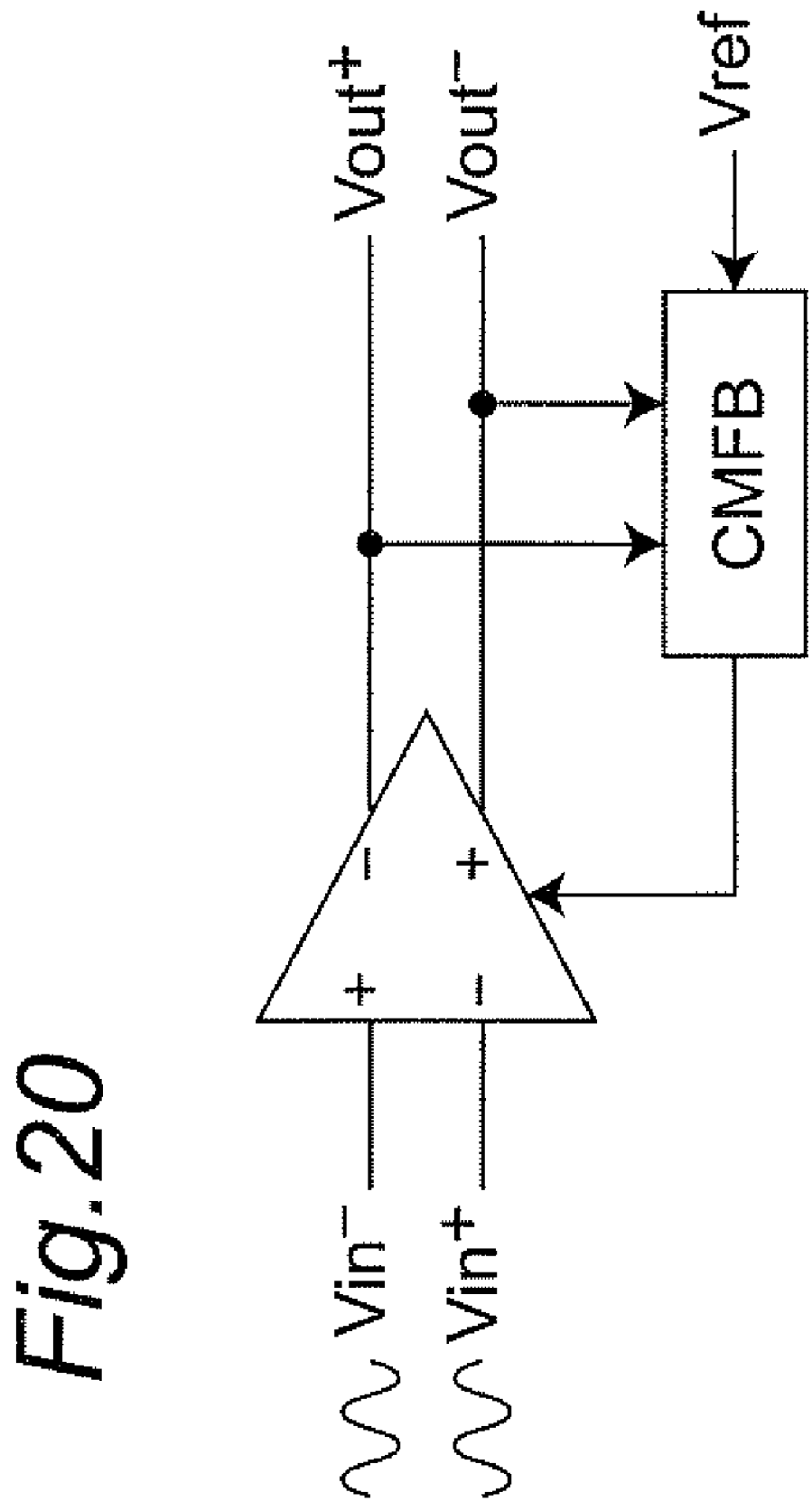
FIG. 20 is a schematic block diagram showing a fully differential amplifier circuit having a CMFB circuit.

As shown in FIG. 17, the CMFB circuit controller 63 in the AD converter according to Embodiment 6 comprises an AND circuit to which a digital signal and a reference clock are input, a D-flip-flop circuit and a saturated state detection circuit 64 serving as a counter. The saturated state detection circuit 64 of the CMFB circuit controller 63 comprises n D-flip-flop circuits connected in cascade and is configured so that its output is delivered from the D-flip-flop circuit of the final stage. FIG. 18 is a flowchart showing the operation of the CMFB circuit controller 63.

When an input digital signal, for example, a "1"-level signal or a "0"-level signal, is input continuously for a predetermined period (number of times: n-th power of 2) to the saturated state detection circuit 64 according to Embodiment 6 (at step 2), the saturated state detection circuit 64 of the CMFB circuit controller 63 detects that the analog signal input to the AD converter is in a saturated state, and the CMFB circuit controller 63 sets the output signal delivered to the amplifier circuit 60 High (at step 4). When the High signal is input from the CMFB circuit controller 63, a CMFB circuit having an appropriate feedback gain in the saturated state is selected, and the AD converter is driven so that the convergence to the steady state is accelerated. When the input digital signal, for example, a "1"-level signal or a "0"-level signal, is not input continuously for the predetermined period (number of times: n-th power of 2) to the saturated state detection circuit 64 serving as a counter, the counter is reset (at step 3).

Although Embodiments 1 to 6 have been described as specific examples of preferred embodiments according to the present invention, the configurations having been described in these embodiments and also corresponding to other embodiments are applicable to the other embodiments as a matter of course. Furthermore, the present invention has the configurations generally included in discrete time amplifier circuits and AD converters, although the configurations are omitted in the respective embodiments.

As described above, the discrete time amplifier circuit and the AD converter according to the present invention are provided with a switched-capacitor common-mode feedback (CMFB) circuit capable of detecting and feeding back an output common-mode voltage at every sampling timing in the case that the circuit operates at double sampling timing (every ½ cycle), thereby being capable of simultaneously attaining high data transmission speed and low current consumption.

Furthermore, the discrete time amplifier circuit and the AD converter according to the present invention are configured so that the output of the discrete time CMFB circuit having a different loop gain every ½ cycle can be fed back to the differential amplifier. Hence, the return from the transient response state to the steady state of the differential amplifier operating at double sampling timing synchronized with a high speed clock can be shortened, and the distortion and noise characteristics of the differential amplifier can be improved using a circuit being simple in configuration and featuring low current consumption.

Since the discrete time CMFB circuit is provided in the present invention, the amplifier circuit can be reduced in current consumption and simplified in configuration, the variation in the output common-mode voltage at double sampling timing can be suppressed, and the setting accuracy of the differential amplifier can be prevented from deteriorating. Moreover, since the CMFB circuit operates every ½ cycle in the present invention, the return time from the transient response state to the steady state can be shortened remarkably.

The present invention provides an amplifier circuit that simultaneously attains high data transmission speed and low current consumption and serves as a highly versatile and useful device applicable to various apparatuses.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claims is:

1. A discrete time amplifier circuit having a differential amplifier for amplifying a differential signal and a common-mode feedback circuit for feeding back the output voltage to said differential amplifier by receiving the output of said differential amplifier so that the output voltage is controlled to a reference voltage, wherein said common-mode feedback circuit comprises:
   a first switched-capacitor circuit being connected, by switching every ½ cycle, to a reference voltage source or the input/output terminals of said common-mode feedback circuit to repeat a sampling mode and a hold mode,
   a second switched-capacitor circuit being connected, by switching every ½ cycle, to said reference voltage source or said input/output terminals at a timing shifted by a ½ cycle from the switching timing of said first switched-capacitor circuit to repeat the sampling mode and the hold mode, and
   a common-mode feedback voltage generating circuit for generating and holding a common-mode feedback voltage using charges input from said first switched-capacitor circuit and said second switched-capacitor circuit.

2. The discrete time amplifier circuit according to claim 1, wherein a first switching signal for ON/OFF driving said first switched-capacitor circuit every ½ cycle and a second switching signal for ON/OFF driving said second switched-capacitor circuit every ½ cycle are set so that said first switched-capacitor circuit and said second switched-capacitor circuit do not turn ON simultaneously.

3. The discrete time amplifier circuit according to claim 1, wherein said first switched-capacitor circuit and said second switched-capacitor circuit each comprise capacitors and multiple switches, and the time interval is adjusted so that the switches that connect the capacitors of said first switched-capacitor circuit and said second switched-capacitor circuit to the input side of said common-mode feedback circuit turn OFF earlier than the switches that connect the capacitors to the output side of said common-mode feedback circuit.

4. The discrete time amplifier circuit according to claim 1, wherein the switches of said first switched-capacitor circuit and said second switched-capacitor circuit are formed of a MOS transistor, each of said switches has a dummy switch formed of a MOS transistor, the drain and source of which are connected to the output side of each of the switches, the gate area of said dummy switch is made smaller than the gate area of each of said switches, and said dummy switch is set so as to turn OFF at the same timing as that of each of said switches.

5. The discrete time amplifier circuit according to claim 1, wherein said switches of said first switched-capacitor circuit and said second switched-capacitor circuit are formed of a CMOS transistor.

6. The discrete time amplifier circuit according to claim 1, wherein said capacitors of said first switched-capacitor circuit and said second switched-capacitor circuit are formed of wires and insulators.

7. The discrete time amplifier circuit according to claim 1, wherein said common-mode feedback voltage generating circuit comprises multiple capacitors having different capacitance values, and said common-mode feedback circuit further comprises a common-mode feedback selection controller for selecting and switching, the capacitance value of said common-mode feedback voltage generating circuit in a steady state and a transient response state.

8. The discrete time amplifier circuit according to claim 7, wherein said common-mode feedback selection controller is set so that the capacitance value to be selected in the transient response state becomes smaller gradually.

9. The discrete time amplifier circuit according to claim 7, wherein said common-mode feedback selection controller is set so that the capacitance value selected in the final stage of the transient response state and the capacitance value selected in the steady state are 10 times the stray capacitance of the circuit from which the capacitance values are selected.

10. The discrete time amplifier circuit according to claim 1, wherein said common-mode feedback circuit is composed of multiple common-mode feedback circuits having different closed-loop gains and conforming to double sampling, and further comprises a common-mode feedback selection controller for selecting, by switching, either one of said multiple common-mode feedback circuits in a steady state and a transient response state.

11. The discrete time amplifier circuit according to claim 1, wherein said common-mode feedback circuit is composed of multiple common-mode feedback circuits having different closed-loop gains and conforming to double sampling, and has a discrete time common-mode feedback circuit and a continuous time common-mode feedback circuit, and said common-mode feedback circuit further comprises a common-mode feedback selection controller for selecting, by switching, either one of said discrete time common-mode feedback circuit and said continuous time common-mode feedback circuit in the steady state and the transient response state.

12. A discrete time analog-digital converter comprising a discrete time amplifier circuit having an operational amplification section conforming to double sampling, a differential amplifier for amplifying a differential signal and a common-mode feedback circuit for feeding back the output voltage to said differential amplifier by receiving the output of said differential amplifier so that the output voltage is controlled to a reference voltage, wherein said common-mode feedback circuit comprises:
   a first switched-capacitor circuit being connected, by switching every ½ cycle, to a reference voltage source or the input/output terminals of said common-mode feedback circuit to repeat a sampling mode and a hold mode,
   a second switched-capacitor circuit being connected, by switching every ½ cycle, to said reference voltage source or said input/output terminals at a timing shifted by a ½ cycle from the switching timing of said first switched-capacitor circuit to repeat the sampling mode and the hold mode, and
   a common-mode feedback voltage generating circuit for generating and holding a common-mode feedback voltage using charges input from said first switched-capacitor circuit and said second switched-capacitor circuit.

13. The discrete time analog-digital converter according to claim 12, wherein said common-mode feedback voltage generating circuit comprises multiple capacitors having different capacitance values, and said common-mode feedback circuit further comprises a common-mode feedback selection controller for selecting and switching, the capacitance value of said common-mode feedback voltage generating circuit in a steady state and a transient response state, and
   said common-mode feedback selection controller selects, by switching, said common-mode feedback circuit at predetermined time intervals in synchronization with the input of power source.

14. The discrete time analog-digital converter according to claim 12, wherein said common-mode feedback voltage generating circuit comprises multiple capacitors having different capacitance values, and said common-mode feedback circuit further comprises a common-mode feedback selection controller for selecting and switching, the capacitance value of said common-mode feedback voltage generating circuit in a steady state and a transient response state, and said common-mode feedback selection controller has a saturated state detection circuit for detecting that the analog input signal is in a saturated state by detecting that the digital output signal of the operational amplification section has reached its maximum or minimum for a preset continuous period or longer, and said common-mode feedback selection controller selects, by switching; said common-mode feedback circuit at preset time intervals when the analog input signal has returned from the saturated state.

* * * * *